(12) United States Patent
Osame et al.

(10) Patent No.: US 7,301,171 B2
(45) Date of Patent: Nov. 27, 2007

(54) DISPLAY DEVICE AND ELECTRONIC DEVICE

(75) Inventors: Mitsuaki Osame, Atsugi (JP); Aya Anzai, Tsukui (JP); Jun Koyama, Sagamihara (JP); Yasuko Watanabe, Atsugi (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 132 days.

(21) Appl. No.: 11/280,728

(22) Filed: Nov. 17, 2005

(65) Prior Publication Data

US 2006/0108588 A1 May 25, 2006

(30) Foreign Application Priority Data

Nov. 19, 2004 (JP) .............................. 2004-336604
Nov. 24, 2004 (JP) .............................. 2004-339652

(51) Int. Cl.
*H01L 29/04* (2006.01)

(52) U.S. Cl. ........................... 257/59; 257/72; 257/83; 257/257; 257/290

(58) Field of Classification Search ..................... None
See application file for complete search history.

(56) References Cited

U.S. PATENT DOCUMENTS

2003/0142244 A1  7/2003  Kato
2004/0075628 A1*  4/2004  Chien et al. ............... 345/82
2004/0135741 A1  7/2004  Tomisawa et al.
2004/0207569 A1* 10/2004  Ho et al. ..................... 345/1.1
2006/0033865 A1*  2/2006  Tanaka et al. .............. 349/113

FOREIGN PATENT DOCUMENTS

| JP | 07-199824   | 8/1995  |
|----|-------------|---------|
| JP | 2001-285445 | 10/2001 |
| JP | 2003-228304 | 8/2003  |
| JP | 2004-062047 | 2/2004  |
| JP | 2004-151370 | 5/2004  |
| JP | 2004-151513 | 5/2004  |
| JP | 2004-240090 | 8/2004  |
| JP | 2005-071693 | 3/2005  |

* cited by examiner

*Primary Examiner*—Wai-Sing Louie
(74) *Attorney, Agent, or Firm*—Fish & Richardson P.C.

(57) ABSTRACT

The invention provides a display device and an electronic device, each of which has one of a structure in which a substrate provided with a light emitting element which performs bottom light emission and a substrate provided with a light emitting element which performs top light emission are attached, and a structure in which two substrates, each of which is provided with a light emitting element which performs bottom light emission are attached. By attaching two substrates, each of which is provided with a light emitting element, displays are provided on the front and back of the display device, thus a high added value can be realized. One of the two substrates, each of which is provided with a light emitting element also functions as a sealing substrate for another substrate, thus a compact, thin, and lightweight display device can be obtained.

16 Claims, 29 Drawing Sheets

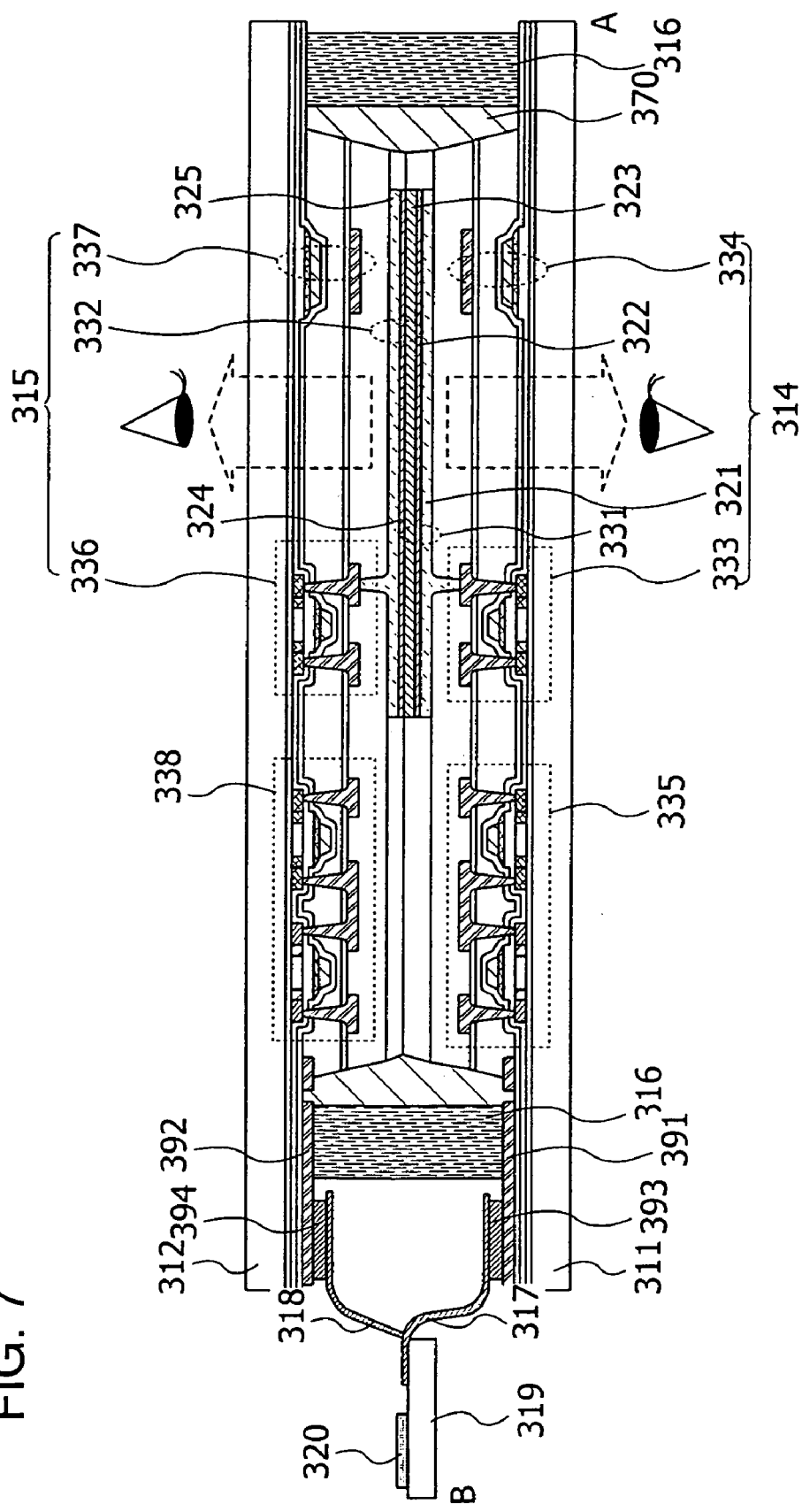

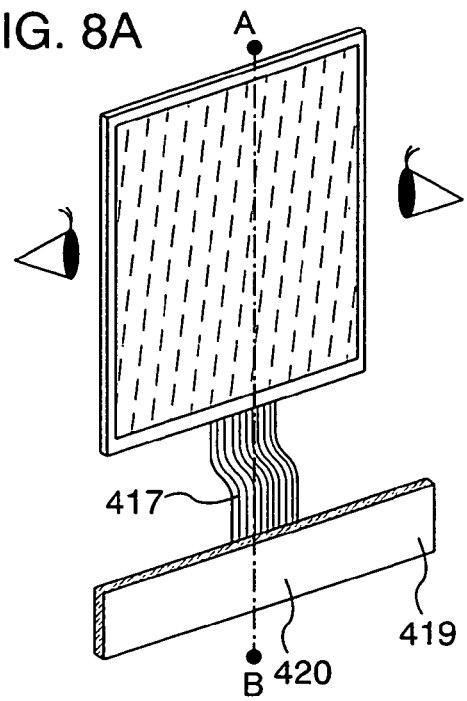
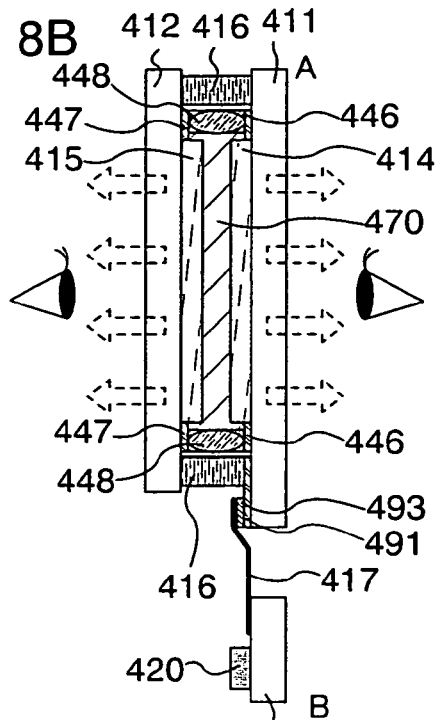
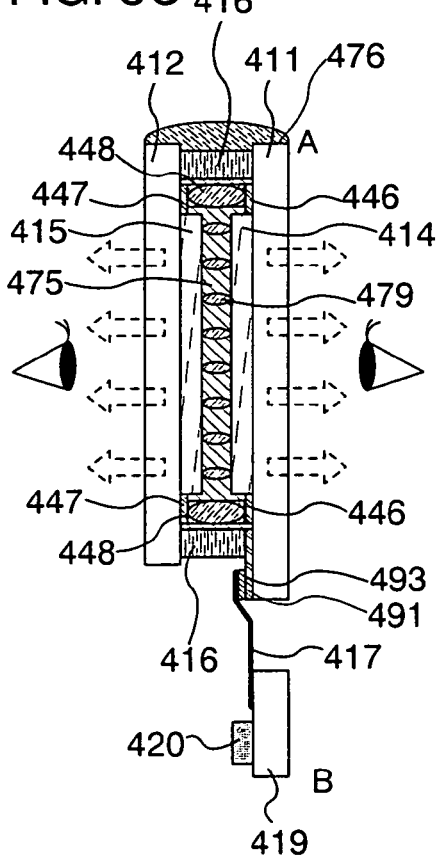
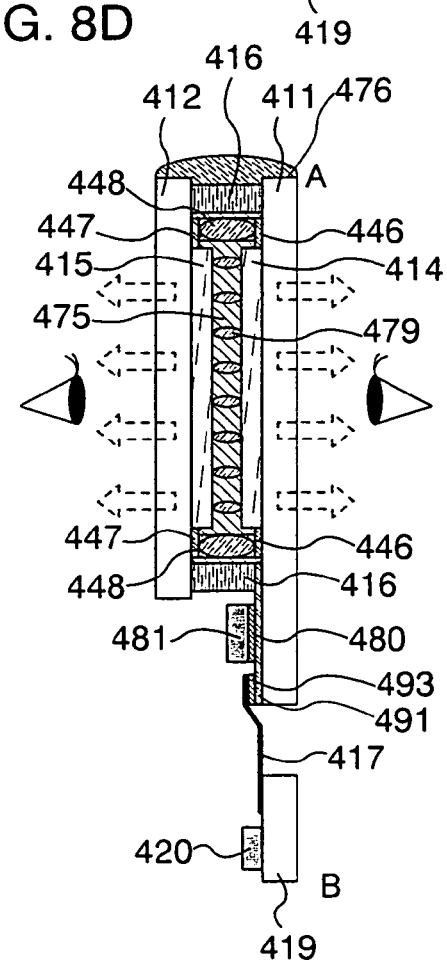

operating state  stand-by state stand-by state  operating state operating state  operating state

9503

9501

DISPLAY DEVICE AND ELECTRONIC DEVICE

BACKGROUND OF THE INVENTION

1. Field of the Invention

The present invention relates to a display device including a self-luminous element and to an electronic device using a display device including a light emitting element.

2. Description of the Related Art

In recent years, a display device using a self-luminous element typified by an electroluminescence element has been developed. A display device using a self-luminous element has advantages such as high image quality, wide viewing angle, thin design without a backlight, and lightweight. A portable electronic device which has been actively spread in these years is required to have a high added value in accordance with the diversification of its applications. Nowadays, a portable electronic device having a sub display on the back of a normal display is provided (for example, see Patent Document 1).

[Patent Document 1]
Japanese Patent Laid-open No. 2001-285445

In many cases, a display device using a self-luminous element includes an element substrate provided with a pixel portion including a light emitting element and a sealing substrate provided to face the element substrate. Therefore, an electronic device provided with a sub display on the back of a normal display has two pairs of an element substrate and a sealing substrate, that is, four substrates in total.

SUMMARY OF THE INVENTION

An electronic device provided with a sub display in addition to a main display is demanded to be downsized, thinner, and lighter, therefore, a backlight, a printed substrate mounting a plurality of semiconductor devices such as IC chips and the like which occupy a large area are becoming obstacles. Accordingly, in an electronic device provided with displays on the front and back thereof, downsizing, thin design, and lightweight are in the relation of trade-off with the added high-value. In view of this, the invention provides a display device and an electronic device which are compact, thin, and lightweight.

A display device in accordance with the invention includes a plurality of element substrates, each of which is provided with a pixel portion including a light emitting element, and one of the plurality of element substrates functions as a sealing substrate for another element substrate. As one element substrate functions as a sealing substrate for another substrate in stead of providing a sealing substrate corresponding to each of the plurality of element substrates, a compact, thin, and lightweight display device can be obtained.

A display device in accordance with the invention includes at least two element substrates provided so as to face each other each of which includes a light emitting element, and thus displays each having a pixel portion is provided on the front and back of the display device. Accordingly, a high added value can be achieved. Further, the display device in accordance with the invention includes two pixel portions which share a controller circuit and a power source circuit. Accordingly, a compact, thin, and lightweight display device can be obtained.

A display device in accordance with the invention includes displays provided on the front and back thereof. A structure of the display device can be roughly classified into three types. A first structure is the case of attaching a substrate provided with a light emitting element which performs bottom light emission and a substrate provided with a light emitting element which performs top light emission, and providing a connecting film for each of the two substrates. A second structure is the case of attaching two substrates, each of which is provided with a light emitting element which performs bottom light emission and providing a connecting film for each of the two substrates. A third structure is the case of attaching two substrates, each of which is provided with a light emitting element which performs bottom light emission and providing a connecting film for one of the two substrates.

It is to be noted that a light emitting element which performs bottom light emission, in the case where the light emitting element is provided over one surface of the element substrate, emits light in a direction of the other surface of the element substrate. Further, a light emitting element which performs top light emission is a light emitting element which emits light in a direction of a sealing substrate provided so as to face the element substrate.

A display device in accordance with the invention, in which a substrate provided with a light emitting element which performs bottom light emission and a substrate provided with a light emitting element which performs top light emission are attached includes a first substrate, a second substrate, and a third substrate. The first and second substrates are provided so that one surface of the first substrate and an opposite surface of the second substrate face each other, and the second and third substrates are provided so that one surface of the second substrate and one surface of the third substrate face each other. A first pixel portion including a first light emitting element is provided over the one surface of the first substrate and a second pixel portion including a second light emitting element is provided over the one surface of the second substrate. The first light emitting element emits light in a direction of an opposite of the first substrate and the second light emitting element emits light in a direction of an opposite of the third substrate. A first display using the first pixel portion is provided over the opposite surface of the first substrate and a second display using the second pixel portion is provided over the opposite surface of the third substrate.

Further, in a display device in accordance with the invention with the aforementioned structure, a first connecting film provided over the one surface of the first substrate and a second connecting film provided over the one surface of the second substrate are provided. The first connecting film is connected to the first pixel portion and the second connecting film is connected to the second pixel portion.

A display device in accordance with the invention, in which two substrates, each of which is provided with a light emitting element which performs bottom light emission are attached, includes a first substrate and a second substrate. The first and second substrates are provided so that one surface of the first substrate and one surface of the second substrate face each other. A first pixel portion including a first light emitting element is provided over the one surface of the first substrate and a second pixel portion including a second light emitting element is provided over the one surface of the second substrate. The first light emitting element emits light in a direction of an opposite surface of the first substrate and the second light emitting element emits light in a direction of an opposite surface of the second substrate. Further, a first display using the first pixel portion is provided over the opposite surface of the first substrate and a second display using the second pixel portion is provided over the opposite surface of the second substrate.

Further, a display device in accordance with the invention with the aforementioned structure includes a first connecting film provided over the one surface of the first substrate and a second connecting film provided over the one surface of the second substrate. The first connecting film is connected to the first pixel portion and the second connecting film is connected to the second pixel portion. A display device in accordance with the invention with the aforementioned structure includes the first and second light emitting elements, each of which has a pair of conductive layers and an electroluminescent layer sandwiched by the pair of conductive layers. One of the pair of conductive layers included in the first light emitting element is the same as one of the pair of conductive layers included in the second light emitting element.

A display device in accordance with the invention, in which two substrates, each of which is provided with a light emitting element which performs bottom light emission are attached includes a first substrate and a second substrate. The first and second substrates are provided so that one surface of the first substrate and one surface of the second substrate face each other. A first connecting conductive layer and a first pixel portion including a first light emitting element are provided over the one surface of the first substrate, and a second connecting conductive layer and a second pixel portion including a second light emitting element are provided over the one surface of the second substrate. The first light emitting element emits light in a direction of an opposite surface of the first substrate and the second light emitting element emits light in a direction of an opposite surface of the second substrate. A first display using the first pixel portion is provided over the opposite surface of the first substrate and a second display using the second pixel portion is provided over the opposite surface of the second substrate. The first connecting conductive layer and the second connecting conductive layer are electrically connected by a conductive spacer material.

A display device in accordance with the invention with the aforementioned structure includes a connecting film provided over the one surface of the first substrate. The connecting film is connected to the first pixel portion and the second pixel portion.

It is to be noted that the connecting film includes a flexible printed wiring board (FPC, Flexible Print Circuit), an LSI (Large Scale Integration) chip mounted on a printed circuit in a film state (TCP (Tape Carrier Package), a TAB-IC (Tape Automated Bonding-IC)) and the like.

One of the first and second displays is a main display while the other is a sub-display. One of the first and second displays is a display for displaying images while the other is a display for displaying only text data.

Further, one or both of a first driver circuit for driving the first pixel portion and a second driver circuit for driving the second pixel portion is provided. The first driver circuit is provided over the one surface of the first substrate and the second driver circuit is provided over the one surface of the second substrate.

Further, the first pixel portion includes a transistor for controlling light emission of the first light emitting element. The second pixel portion includes a transistor for controlling light emission of the second light emitting element.

Further, a display device of the invention includes a controller circuit for supplying a control signal to the first and second pixel portions. Further, a display device in accordance with the invention includes a power source circuit for supplying a power source potential to the first and second pixel portions. The display device in accordance with the invention also includes a switching circuit and a controller circuit for supplying a control signal to the first or second pixel portion based on a signal outputted from the switching circuit. The display device in accordance with the invention also includes a switching circuit and a power source circuit for supplying a power source potential to the first or second pixel portion based on a signal outputted from the switching circuit. In a display device in accordance with the invention, as the controller circuit and the power source circuit are shared by the pixel portions provided on the front and back thereof, the number of IC chips (semiconductor devices) can be reduced and a compact, thin, and lightweight display device can be obtained.

Further, a display device in accordance with the invention includes a controller circuit for supplying a control signal to the first and second pixel portions. The controller circuit is provided over the one surface of the first substrate or the one surface of the second substrate. Further, the display device in accordance with the invention includes a power source circuit for supplying a power source potential to the first and second pixel portions. The power source circuit is provided over the one surface of the first substrate or the one surface of the second substrate. The display device in accordance with the invention includes a switching circuit and a controller circuit for supplying a control signal to the first pixel portion or the second pixel portion based on a signal outputted from the switching circuit. The switching circuit and the controller circuit are provided over the one surface of the first substrate or the one surface of the second substrate. The display device in accordance with the invention includes a switching circuit and a power source circuit for supplying a power source potential to the first or second pixel portion based on a signal outputted from the switching circuit. The switching circuit and the power source circuit are provided over the one surface of the first substrate or the one surface of the second substrate.

Further, the invention provides an electronic device using a display device with the aforementioned structure. For example, a portable terminal, a portable information terminal, a camera such as a digital camera and a digital video camera are provided.

Further, the invention uses a plurality of element substrates, each of which is provided with a pixel portion including a light emitting element. An area of a pixel portion of one element substrate and an area of a pixel portion of another element substrate are different from each other. Therefore, in accordance with the invention, an area of a display using a pixel portion of one element substrate and an area of a display using a pixel portion of another element substrate are different from each other. In this manner, the areas of the displays of at least two element substrates are different from each other while one element substrate also functions as a sealing substrate for another element substrate, thus an area of one element substrate and an area of another element substrate are the same.

Accordingly, in order to efficiently use an element substrate having a small pixel portion, a functional circuit portion including at least one transistor as well as a pixel portion including a light emitting element are provided on the element substrate. The functional circuit portion includes at least one transistor which form one or a plurality selected from a central processing circuit (CPU, Central Processing Unit), a memory circuit, a buffer circuit, an interface circuit, a timing signal generating circuit, a format converter circuit, a frame memory circuit, an image processing circuit, an audio processing circuit, a transmission/reception circuit, a correction circuit, a time detection circuit, a temperature detection circuit, an illuminance detection circuit, a register circuit, a decoder circuit, a divider circuit, a digital signal processing circuit and the like. By providing the functional circuit portion, the number of IC chips (semiconductor devices) which are provided externally can be reduced, and thus a compact, thin, and lightweight display device can be obtained.

A display device in accordance with the invention, in which an substrate provided with a light emitting element which performs bottom light emission and a substrate provided with a light emitting element which performs top light emission are attached, includes a first substrate, a second substrate, and a third substrate. The first and second substrates are provided so that one surface of the first substrate and an opposite surface of the second substrate face each other. The second and third substrates are provided so that one surface of the second substrate and one surface of the third substrate face each other. A first pixel portion including a first light emitting element is provided over the one surface of the first substrate and a second pixel portion including a second light emitting element is provided over the one surface of the second substrate. Further, the first light emitting element emits light in a direction of an opposite surface of the first substrate and the second light emitting element emits light in a direction of an opposite surface of the third substrate. Therefore, a first display using the first pixel portion is provided over the opposite surface of the first substrate, the second display using the second pixel portion is provided over the opposite surface of the third substrate, and the functional circuit portion including at least one transistor is provided over the one surface of the first substrate or the one surface of the second substrate. The areas of the first and second displays are different from each other.

A display device in accordance with the invention, in which substrates, each of which is provided with a light emitting element which performs bottom light emission are attached, includes a first substrate and a second substrate. The first and second substrates are provided so that one surface of the first substrate and one surface of the second substrate face each other. A first pixel portion including a first light emitting element is provided over the one surface of the first substrate and a second pixel portion including a second light emitting element is provided over the one surface of the second substrate. The first light emitting element emits light in a direction of an opposite surface of the first substrate and the second light emitting element emits light in a direction of an opposite surface of the second substrate. A first display using the first pixel portion is provided over the opposite surface of the first substrate and a second display using the second pixel portion is provided over the opposite surface of the second substrate. A functional circuit portion including at least one transistor is provided over the one surface of the first substrate or the one surface of the second substrate. The areas of the first and second displays are different from each other.

A display device in accordance with the invention, in which two substrates, each of which is provided with a light emitting element which performs bottom light emission are attached, includes a first substrate and a second substrate. The first and second substrates are provided so that one surface of the first substrate and one surface of the second substrate face each other. A first connecting conductive layer and a first pixel portion including a first light emitting element are provided over the one surface of the first substrate, a second connecting conductive layer and a second pixel portion including a second light emitting element are provided over the one surface of the second substrate. The first light emitting element emits light in a direction of the opposite surface of the first substrate and the second light emitting element emits light in a direction of an opposite surface of the second substrate. A first display using the first pixel portion is provided over the opposite surface of the first substrate, and a second display using the second pixel portion is provided over the opposite surface of the second substrate. The first and second connecting conductive layers are electrically connected by a conductive spacer material. A functional circuit portion including at least one transistor is provided over the one surface of the first substrate or the one surface of the second substrate. The areas of the first and second displays are different from each other.

A display device in accordance with the invention with the aforementioned structure includes a first connecting film provided over the one surface of the first substrate and a second connecting film provided over the one surface of the second substrate. The first connecting film is connected to the first pixel portion and the second connecting film is connected to the second pixel portion. The first and second connecting films are connected to a functional circuit portion.

A display device in accordance with the invention with the aforementioned structure includes a connecting film provided over the one surface of the first substrate. The connecting film is connected to the first and the second pixel portions and the functional circuit portion.

A display device in accordance with the invention includes a functional circuit portion. At least one transistor included in the functional circuit portion form one or a plurality selected from a memory circuit, a central processing circuit, a buffer circuit, an interface circuit, a timing signal generating circuit, a format converter circuit, a frame memory circuit, an image processing circuit, an audio processing circuit, a transmission/reception circuit, a correction circuit, a time detection circuit, a temperature detection circuit, an illuminance detection circuit, a register circuit, a decoder circuit, a divider circuit, or a digital signal processing circuit.

A display device in accordance with the invention with the aforementioned structure includes the first pixel portion including a transistor for controlling light emission of the first light emitting element. The second pixel portion includes a transistor for controlling light emission of the second light emitting element. Further, the controller circuit for supplying a control signal to the first and second pixel portions is provided. Further, a display device in accordance with the invention includes a switching circuit and a controller circuit for supplying a control signal to the first and second pixel portions based on a signal outputted from the switching circuit. The display device in accordance with the invention also includes a power source circuit for supplying a power source potential to the first and second pixel portions. Further, the display device in accordance with the invention includes a switching circuit and a power source circuit for supplying a power source potential to the first or second pixel portion based on a signal outputted from the switching circuit. Further, an electronic device in accordance with the invention employs a display device with any one of the aforementioned structures.

A display device in accordance with the invention includes a plurality of element substrates, each of which is provided with a pixel portion including a light emitting element. One of the plurality of element substrates also functions as a sealing substrate for another element substrate. As one element substrate functions as a sealing substrate for another element substrate instead of providing a sealing substrate corresponding to each of the plurality of element substrates, a compact, thin, and lightweight display device can be obtained.

That is to say, at least one of the plurality of element substrates also functions as a sealing substrate for another element substrate. As at least one of the plurality of element substrates functions as a sealing substrate for another element substrate instead of providing a sealing substrate corresponding to each of the plurality of element substrates, the number of substrates can be reduced. Accordingly, a compact, thin, and lightweight display device can be obtained.

A display device in accordance with the invention includes at least two element substrates provided so as to face each other, each of which is provided with a light emitting element. Therefore, displays each of which includes a pixel portion is provided on the front and back of the display device. By the aforementioned features, a high added value can be achieved. A display device in accordance with the invention includes two pixel portions which share a controller circuit and a power source circuit. Accordingly, a compact, lightweight, and inexpensive display device can be obtained.

BRIEF DESCRIPTION OF THE DRAWINGS

FIG. 7 is a diagram showing a display device of the invention.

FIGS. 8A to 8D are diagrams, each of which shows a display device of the invention.

DETAILED DESCRIPTION OF THE INVENTION

Figure 1A:
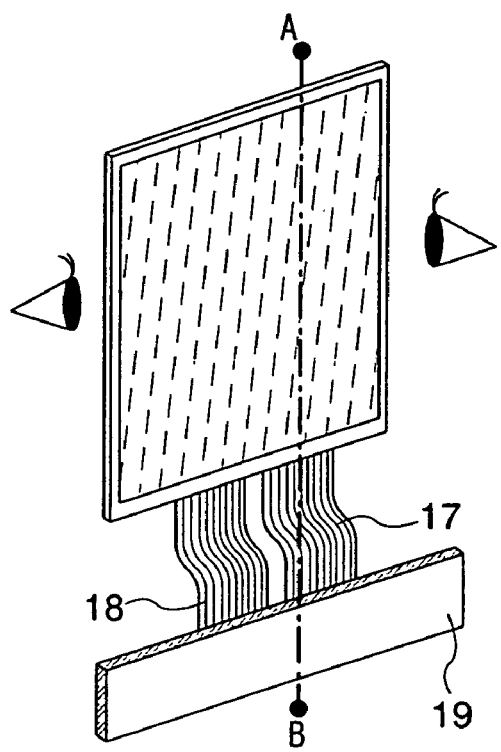
FIGS. 1A to 1C are diagrams, each of which shows a display device of the invention.

Although the invention will be fully described by way of embodiment modes and embodiments with reference to the accompanying drawings, it is to be understood that various changes and modifications will be apparent to those skilled in the art. Therefore, unless otherwise such changes and modifications depart from the scope of the invention, they should be construed as being included therein. Note that identical portions in different drawings are denoted by the same reference numerals.

EMBODIMENT MODE 1

A display device in accordance with the invention is provided with displays on the front and back thereof. A structure of the display device can be roughly classified into three types. A first structure is the case of attaching a substrate provided with a light emitting element which performs bottom light emission and a substrate provided with a light emitting element which performs top light emission, and providing a connecting film for each of the two substrates (see FIGS. 1A to 1C). A second structure is the case of attaching two substrates, each of which is provided with a light emitting element which performs bottom light emission and providing a connecting film for each of the two substrates (see FIGS. 4A and 4B). A third structure is the case of attaching two substrates, each of which is provided with a light emitting element which performs bottom light emission and providing a connecting film for one of the two substrates (see FIGS. 8A to 8D).

Figure 1B:
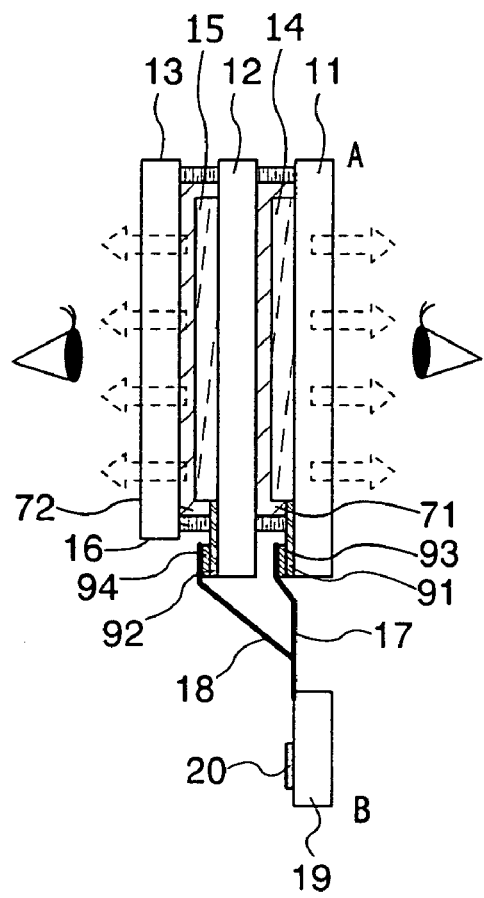
Figure 1C:
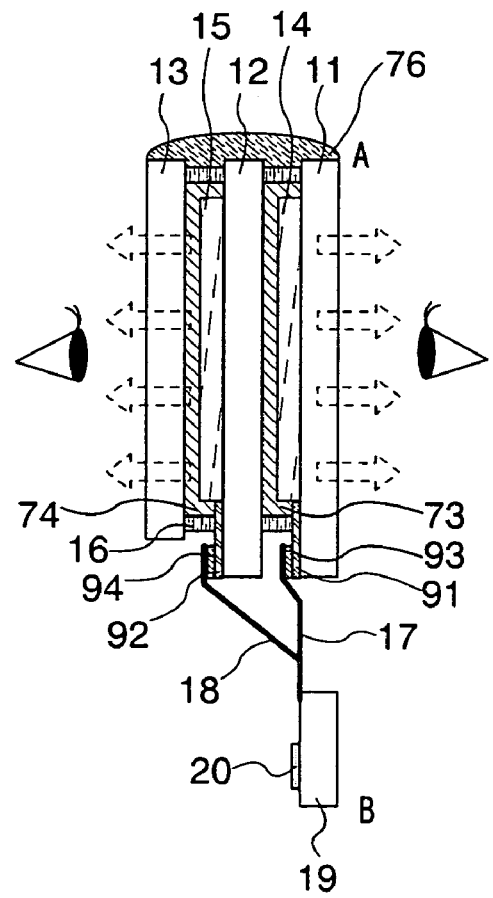

First, description is made on the case of attaching a substrate provided with a light emitting element which performs bottom light emission and a substrate provided with a light emitting element which performs top light emission, and providing a connecting film for each of the two substrates (see FIGS. 1A to 1C). A display device in accordance with the invention includes a first substrate 11, a second substrate 12, and a third substrate 13. The first substrate 11 and the second substrate 12 are provided so that one surface of the first substrate 11 and an opposite surface of the second substrate 12 face each other. Further, the second substrate 12 and the third substrate 13 are provided so that one surface of the second substrate 12 and one surface of the third substrate 13 face each other. Each of the first substrate 11 and the second substrate 12, and the second substrate 12 and the third substrate 13 is attached by a sealing material 16.

A first pixel portion 14 including a first light emitting element is provided over the one surface of the first substrate 11. The first light emitting element included in the first pixel portion 14 emits light in a direction of an opposite surface of the first substrate 11. A second pixel portion 15 including a second light emitting element is provided over the one surface of the second substrate 12. The second light emitting element included in the second pixel portion 15 emits light in a direction of an opposite surface of the third substrate 13. That is, the first light emitting element included in the first pixel portion 14 performs bottom light emission while the second light emitting element included in the second pixel portion 15 performs top light emission. Accordingly, a first display using the first pixel portion is provided over the opposite surface of the first substrate 11 while a second display using the second pixel portion is provided over the opposite surface of the third substrate 13.

A first connecting film 17, an anisotropic conductive layer 93, and a connecting conductive layer 91 are provided over the one surface of the first substrate 11. The first connecting film 17 is connected to the first pixel portion 14 through the anisotropic conductive layer 93 and the connecting conductive layer 91. Further, a second connecting film 18, an anisotropic conductive layer 94, and a connecting conductive layer 92 are provided over the one surface of the second substrate 12. The second connecting film 18 is connected to the second pixel portion 15 through the anisotropic conductive layer 94 and the connecting conductive layer 92.

The first connecting film 17 and the second connecting film 18 are provided so as not to overlap each other. A stack of the connecting conductive layer 91 and the anisotropic conductive layer 93 and a stack of the connecting conductive layer 92 and the anisotropic conductive layer 94 are provided so as not to overlap each other when the first substrate 11, the second substrate 12, and the third substrate 13 are overlapped.

The first connecting film 17 and the second connecting film 18 are both connected to a printed substrate 19. The printed substrate 19 includes at least one IC chip (semidonductor device) 20. Each of the at least one IC chip 20 corresponds to one or a plurality selected from a controller circuit, a power source circuit, a central processing circuit (CPU, Central Processing Unit) and the like. The IC chip 20 supplies a signal and a power source potential to the first pixel portion 14 and the second pixel portion 15 through the first connecting film 17 and the second connecting film 18.

The space between the one surface of the first substrate 11 and the opposite surface of the second substrate 12 is filled with inert gas 71. The space between the one surface of the second substrate 12 and the one surface of the third substrate 13 is filled with an inert gas 72 (see FIG. 1B). The inert gases 71 and 72 are, for example, a noble gas, a nitrogen gas, and the like.

Instead of filling the space between the substrates with an inert gas, a sealing resin layer 73 may be provided between the one surface of the first substrate 11 and the opposite surface of the second substrate 12 and a sealing resin layer 74 may be provided between the one surface of the second substrate 12 and the one surface of the third substrate 13 (see FIG. 1C). The sealing resin layers 73 and 74 may be formed of a heat curable resin material or an ultraviolet curable resin material. Further, when providing the sealing resin layers 73 and 74, a spacer material may be provided as well as the sealing resin layers 73 and 74 in order to keep a distance between the substrates even. Furthermore, a layer (hereinafter sometimes abbreviated as a barrier layer) containing a material having a high barrier property such as a metal oxide and a nitride oxide may be provided as well. In this manner, as a method for preventing deterioration of a light emitting element, any one of or a plurality of a method for filling the space with an inert gas, a method for providing a sealing resin layer, and a method for providing a barrier layer may be used.

Further, the first substrate 11 and the second substrate 12, and the second substrate 12 and the third substrate 13 are attached by the sealing material 16, however, a sealing material 76 may be further provided at edge portions of the first substrate 11, the second substrate 12, and the third substrate 13 to further enhance the strength of the attachment among the substrates (see FIG. 1C).

An IC chip (a semiconductor device) may be provided over the one surface of the first substrate 11 and the one surface of the second substrate 12 by the COG (Chip On Glass) method. The IC chip functions as a driver circuit which controls operations of the first pixel portion 14 and the second pixel portion 15. It is to be noted that the IC chip has a thickness of about 30 μm at the thinnest, while the distance between the two substrates is about 10 μm. Accordingly, in the case of providing an IC chip over the one surface of the first substrate 11, it is preferable to intentionally make the distance between the first substrate 11 and the second substrate 12 wider.

Next, description is made with reference to the drawings on sectional structures of a display device with the aforementioned structure (see FIGS. 1A to 1C). Each of the first pixel portion 14 and the second pixel portion 15 may be either an active matrix type in which a light emitting element and a transistor are provided in each pixel or a passive matrix type in which a light emitting element only is provided in each pixel. There are four types of combinations. First is the case where the first pixel portion 14 and the second pixel portion 15 are both active matrix type, second is the case where the first pixel portion 14 is the active matrix type and the second pixel portion 15 is the passive matrix type, third is the case where the first pixel portion 14 is the passive matrix type and the second pixel portion 15 is the active matrix type, and fourth is the case where the first pixel portion 14 and the second pixel portion 15 are both passive matrix type. Hereinafter described are sectional structures of the case where the first pixel portion 14 and the second pixel portion 15 are both active matrix type (see FIG. 2) and the case where the first pixel portion 14 is the passive matrix type and the second pixel portion 15 is the active matrix type (see FIG. 3).

It is to be noted that reference numerals denoting the same portions in FIGS. 1B, 1C, 2, and 3 are commonly used in different drawings. Hereinafter, descriptions on the portions denoted by the same reference numerals are omitted.

Figure 2:
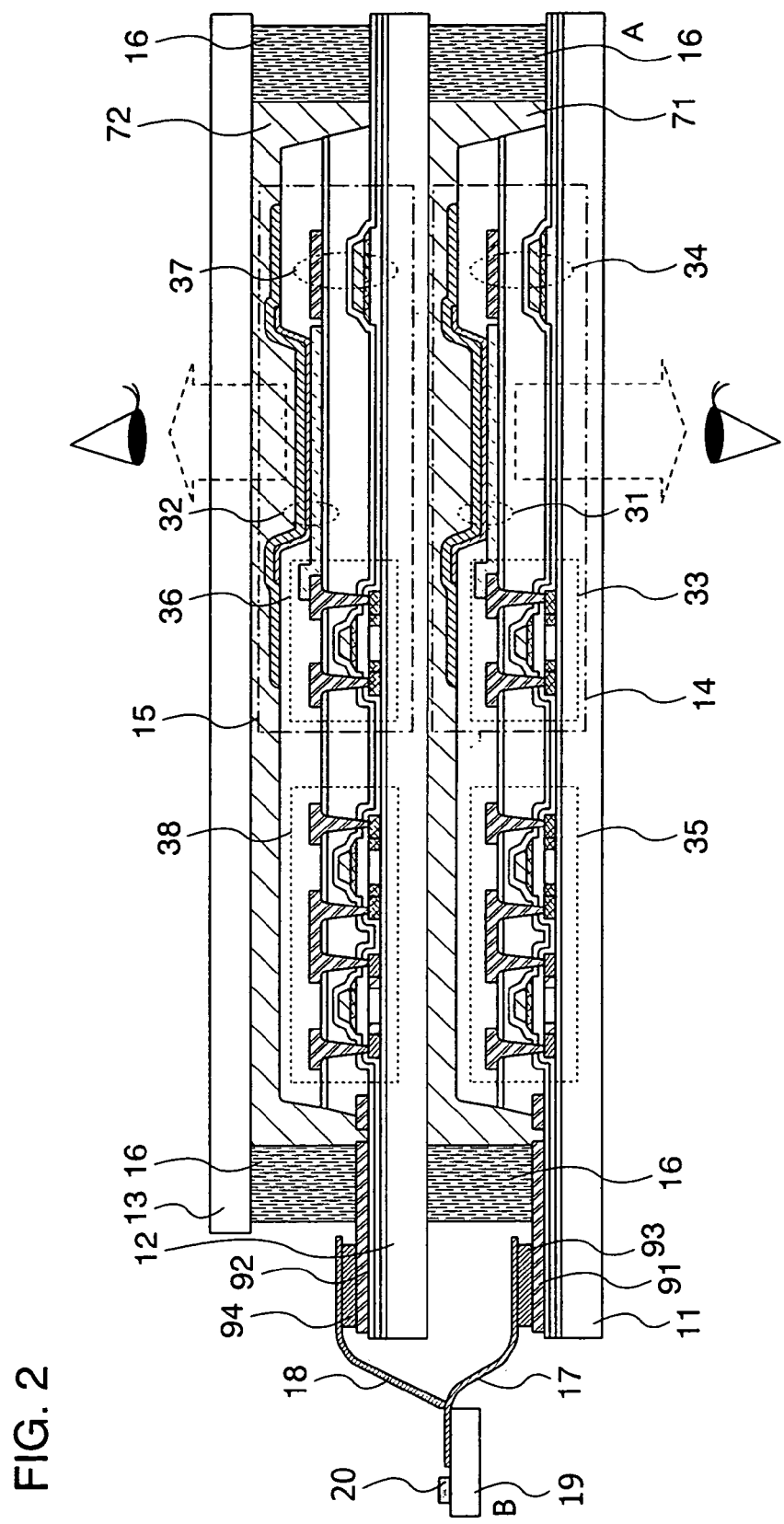
FIG. 2 is a diagram showing a display device of the invention.

First, description is made on a sectional diagram of the case where the first pixel portion 14 and the second pixel portion 15 are both active matrix type (see FIG. 2). The first pixel portion 14 and a driver circuit 35 are provided over the one surface of the first substrate 11. The first pixel portion 14 includes a first light emitting element 31, a driving transistor 33, and a capacitor 34. The driver circuit 35 includes an N-type (N-channel) transistor and a P-type (P-channel) transistor connected in series. The first light emitting element 31 has a structure in which an electroluminescent layer is sandwiched between a pair of conductive layers. One of the pair of conductive layers of the first light emitting element 31 is connected to a conductive layer which functions as a source wiring or a drain wiring of the driving transistor 33. The space between the first substrate 11 and the second substrate 12 is filled with the inert gas 71.

The second pixel portion 15 and a driver circuit 38 are provided over the one surface of the second substrate 12. The second pixel portion 15 includes a second light emitting element 32, a driving transistor 36, and a capacitor 37. The driver circuit 38 includes an N-type transistor and a P-type transistor connected in series. The second light emitting element 32 has a structure in which an electroluminescent layer is sandwiched between a pair of conductive layers. One of the pair of conductive layers of the second light emitting element 32 is connected to a conductive layer which functions as a source wiring or a drain wiring of the driving transistor 36. The space between the second substrate 12 and the third substrate 13 is filled with the inert gas 72. The driver circuits 35 and 38 correspond to functional circuits such as a source driver, a gate driver, a central processing circuit, an image processing circuit and the like.

In the aforementioned structure, the first light emitting element 31 included in the first pixel portion 14 performs bottom light emission while the second light emitting element 32 included in the second pixel portion 15 performs top light emission. Therefore, a first display using the first pixel portion 14 is provided over the opposite surface of the first substrate 11 and a second display using the second pixel portion 15 is provided over the opposite surface of the third substrate 13.

Figure 3:
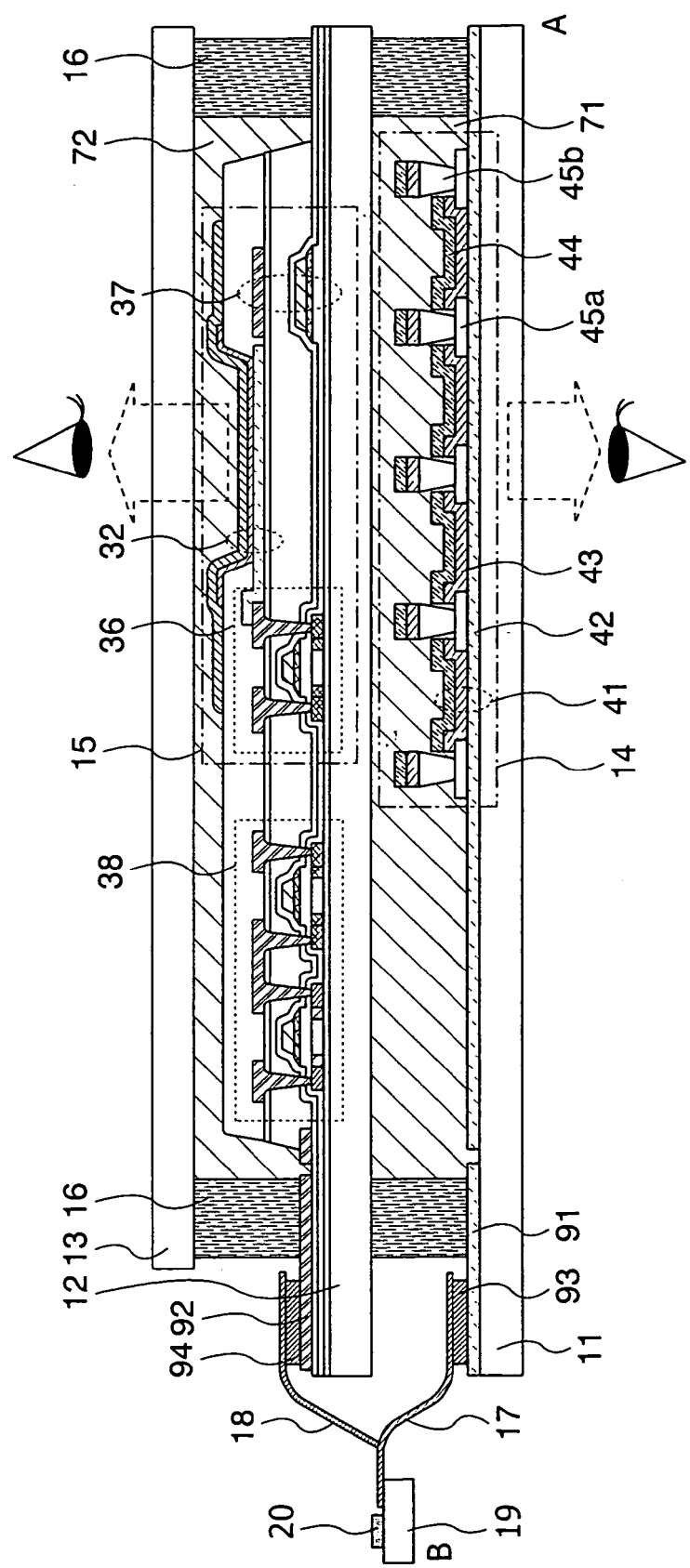
FIG. 3 is a diagram showing a display device of the invention.

Next, description is made on a sectional structure of the case where the first pixel portion 14 is the passive matrix type and the second pixel portion 15 is the active matrix type (see FIG. 3). The first pixel portion 14 is provided over the one surface of the first substrate 11. The first pixel portion 14 includes a first light emitting element 41. The first light emitting element 41 corresponds to a stack of a conductive layer 42, an electroluminescent layer 43, and a conductive layer 44. Insulating layers 45a and 45b are provided between the adjacent first light emitting elements 41. The space between the first substrate 11 and the second substrate 12 is filled with the inert gas 71.

The second pixel portion 15 and the driver circuit 38 are provided over the one surface of the second substrate 12. The second pixel portion 15 includes the second light emitting element 32, the driving transistor 36, and the capacitor 37. The driver circuit 38 includes an N-type transistor and a P-type transistor connected in series. The space between the second substrate 12 and the third substrate 13 is filled with the inert gas 72.

In the aforementioned structure, the first light emitting element 41 included in the first pixel portion 14 performs bottom light emission and the second light emitting element 32 included in the second pixel portion 15 performs top light emission. Therefore, a first display using the first pixel portion 14 is provided over the opposite surface of the first substrate 11 and a second display using the second pixel portion 15 is provided over the opposite surface of the third substrate 13.

In the aforementioned structure (see FIGS. 2 and 3), the space between the first substrate 11 and the second substrate 12 is filled with the inert gas 71 and the space between the second substrate 12 and the third substrate 13 is filled with the inert gas 72. However, the invention is not limited to this mode and the space between the substrates may be filled with a resin and a barrier layer may be provided so as to cover the first light emitting elements 31 and 41, and the second light emitting element 32.

EMBODIMENT MODE 2

Figure 4A:
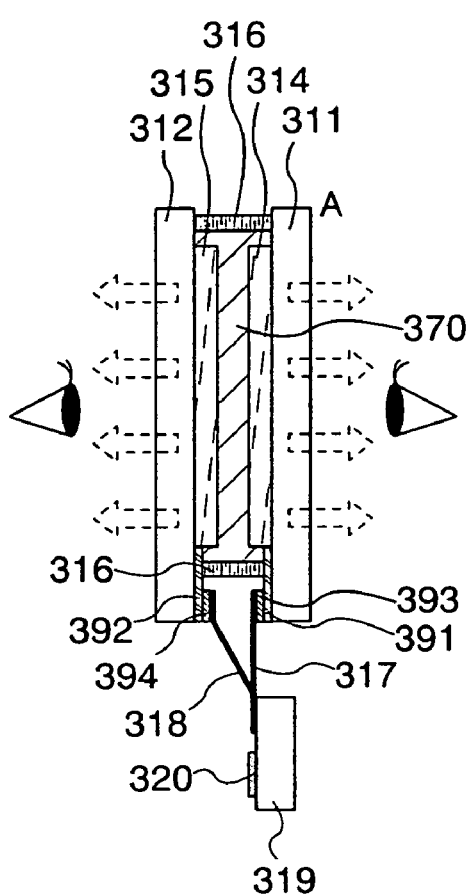
FIGS. 4A and 4B are diagrams, each of which shows a display device of the invention.
Figure 4B:
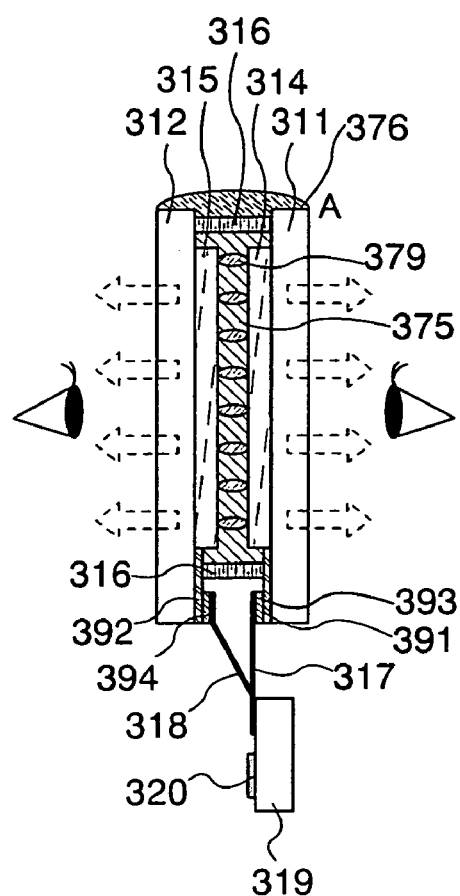

Next, description is made on the case where two substrates, each of which is provided with a light emitting element which performs bottom light emission are attached and a connecting film is provided for each of the two substrates (see FIGS. 4A and 4B). A display device in accordance with the invention includes a first substrate 311 and a second substrate 312. The first substrate 311 and the second substrate 312 are provided so that one surface of the first substrate 311 and one surface of the second substrate 312 face each other. The first substrate 311 and the second substrate 312 are attached by a sealing material 316.

A first pixel portion 314 including a first light emitting element is provided over one surface of the first substrate 311. The first light emitting element included in the first pixel portion 314 emits light in a direction of an opposite surface of the first substrate 311. A second pixel portion including a second light emitting element is provided over the one surface of the second substrate 312. The second light emitting element included in the second pixel portion 315 emits light in a direction of an opposite surface of the second substrate 312. That is, the first light emitting element included in the first pixel portion 314 and the second light emitting element included in the second pixel portion 315 both perform bottom light emission. Therefore, a first display using the first pixel portion 314 is provided over opposite other surface of the first substrate 311 and a second display using the second pixel portion 315 is provided over the opposite surface of the second substrate 312.

A first connecting film 317, an anisotropic conductive layer 393, and a connecting conductive layer 391 are provided over the one surface of the first substrate 311. A second connecting film 318, an anisotropic conductive layer 394, and a connecting conductive layer 392 are provided over the one surface of the second substrate 312. The first connecting film 317 and the second connecting film 318 are both connected to a printed substrate 319. The printed substrate 319 is provided with at least one IC chip (semiconductor device) 320. Is it to be noted that a film provided with connecting terminals on both surfaces (one surface and an opposite surface) may be used as the second connecting film 318. Further, two films each of which is provided with a connecting terminal on one surface thereof and a connector for electrically connecting the two films may be used as the second connecting film 318.

The space between the one surface of the first substrate 311 and the one surface of the second substrate 312 is filled with an inert gas 370 (see FIG. 4A), however, a sealing resin layer 375 may be provided instead of the inert gas 370 (see FIG. 4B). In the case of providing the sealing resin layer 375, a spacer material 379 as well as the sealing resin layer 375 may be provided in order to keep a distance between the substrates even. Further, a barrier layer may be provided so as to cover the light emitting element. The first substrate 311 and the second substrate 312 are attached by the sealing material 316, however, a sealing material 376 may be provided at edge portions of the first substrate 311 and the second substrate 312 in order to further enhance the strength of attachment between the substrates (see FIG. 4B). Further, an IC chip (semiconductor device) may be provided over the one surface of the first substrate 311 and the one surface of the second substrate 312 by the COG method. The IC chip is used as a driver circuit for controlling operations of the first pixel portion 314 and the second pixel portion 315. The IC chip has a thickness of about 30 μm at the thinnest, while the distance between the first substrate 311 and the second substrate 312 is about 10 μm. Accordingly, in the case of providing an IC chip over the one surface of the first substrate 311 and the one surface of the second substrate 312, it is preferable to intentionally make the distance between the first substrate 311 and the second substrate 312 wider.

Next, description is made with reference to the drawings on a detailed sectional structure of a display device with the aforementioned structure (see FIGS. 4A and 4B). Each of the first pixel portion 314 and the second pixel portion 315 may be either the active matrix type or the passive matrix type. There are four types of combinations. Hereinafter described are sectional structures of the case where the first pixel portion 314 and the second pixel portion 315 are both active matrix type (see FIG. 5), the case where the first pixel portion 314 is the active matrix type and the second pixel portion 315 is the passive matrix type (see FIG. 6), and the case where the first pixel portion 314 and the second pixel portion 315 are both active matrix type (see FIG. 7).

It is to be noted that reference numerals denoting the same portions in FIGS. 4A, 4B, and 5 to 7 are commonly used in different drawings. Hereinafter, descriptions on the portions denoted by the same reference numerals are omitted.

Figure 5:
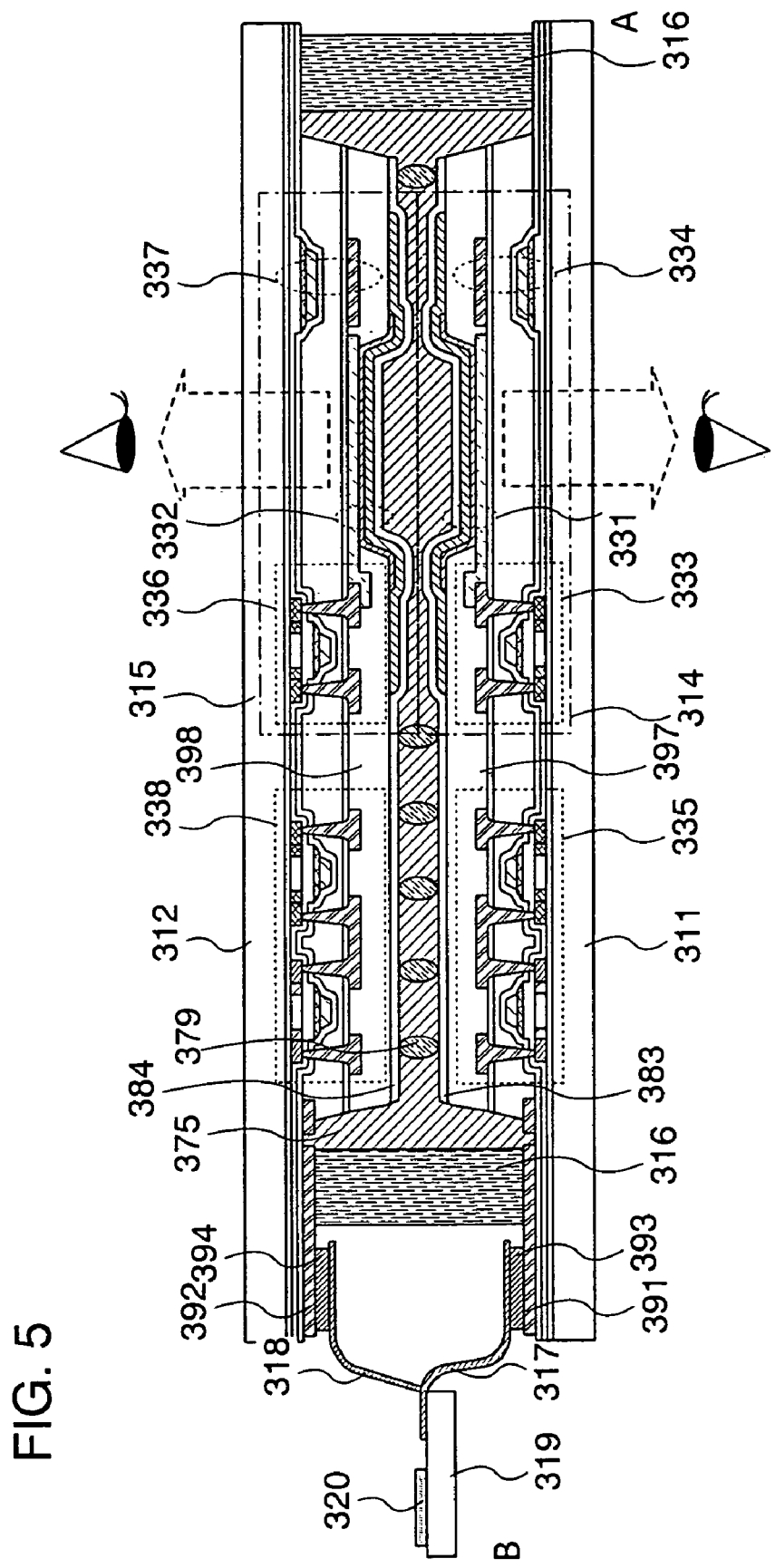
FIG. 5 is a diagram showing a display device of the invention.

First, description is made on a sectional structure of the case where the first pixel portion 314 and the second pixel portion 315 are both active matrix type (see FIG. 5). The first pixel portion 314 and a driver circuit 335 are provided over the one surface of the first substrate 311. The first pixel portion 314 includes a first light emitting element 331, a driving transistor 333, and a capacitor 334. The driver circuit 335 includes an N-type transistor and a P-type transistor connected in series. The second pixel portion 315 and a driver circuit 338 are provided over the one surface of the second substrate 312. The second pixel portion 315 includes a second light emitting element 332, a driving transistor 336, and a capacitor 337. The driver circuit 338 includes an N-type transistor and a P-type transistor connected in series.

In the aforementioned structure, the first light emitting element 331 included in the first pixel portion 314 and the second light emitting element 332 included in the second pixel portion 315 both perform bottom light emission. Accordingly, a first display using the first pixel portion 314 is provided over the opposite surface of the first substrate 311 and a second display using the second pixel portion 315 is provided over the opposite surface of the second substrate 312.

In the aforementioned structure, a barrier layer 383 is provided so as to cover the first light emitting element 331 and a barrier layer 384 is provided so as to cover the second light emitting element 332. Further, a sealing resin layer 375 is provided between the first substrate 311 and the second substrate 312. By providing the barrier layers 383 and 384, and the sealing resin layer 375, deterioration of the first light emitting element 331 and the second light emitting element 332 can be prevented. Further, short-circuits of the first light emitting element 331 and the second light emitting element 332 can be prevented.

Further, in the aforementioned structure, a spacer material 379 is provided between the first substrate 311 and the second substrate 312. By providing the spacer material 379, a distance between the first substrate 311 and the second substrate 312 can be kept even. It is to be noted that the spacer material 379 may be provided between the first substrate 311 and the second substrate 312 as many as required, however, it is preferably provided only over insulating layers 397 and 398 which function as partitions.

Figure 6:
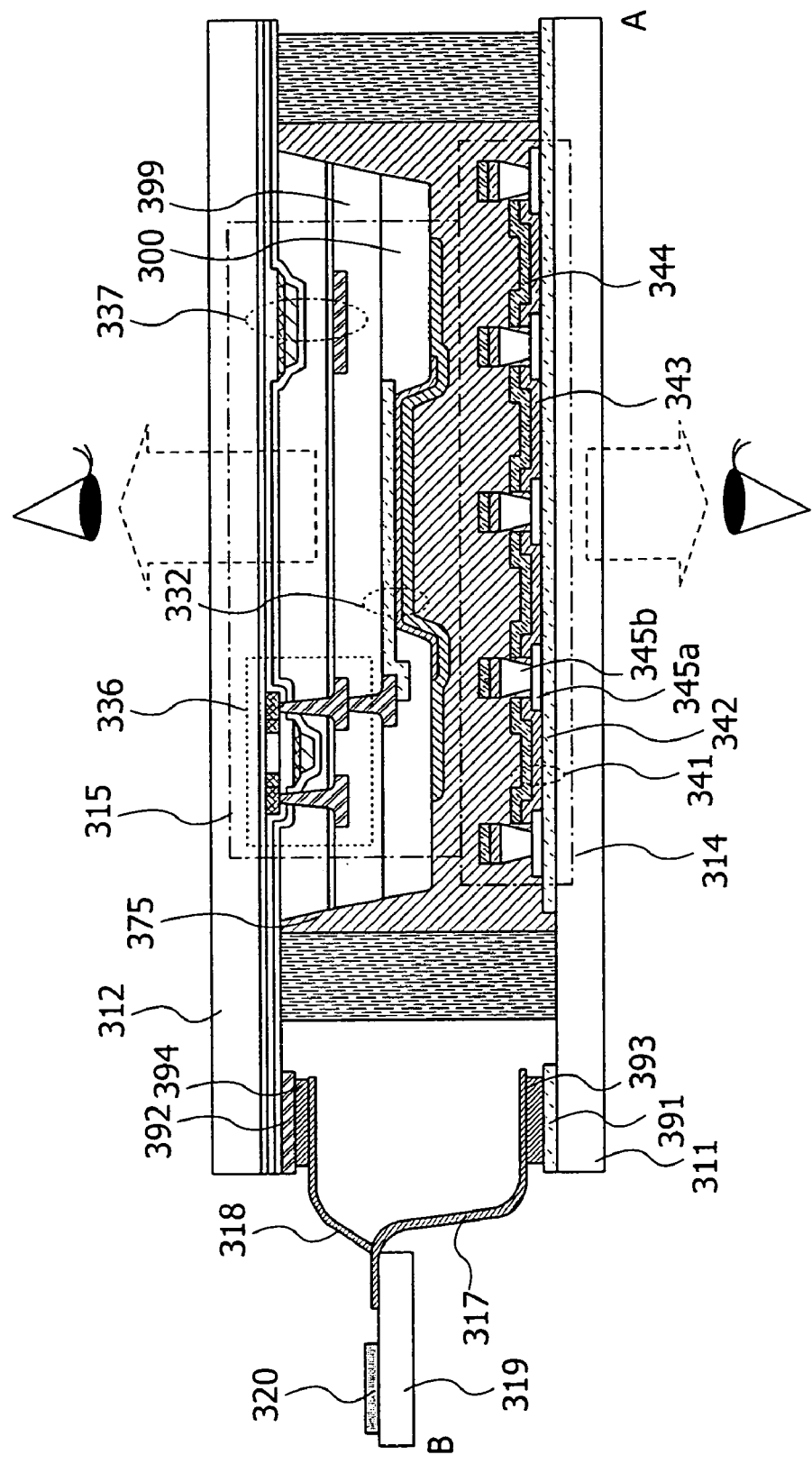
FIG. 6 is a diagram showing a display device of the invention.

Next, description is made on a sectional structure of the case where the first pixel portion 314 is the passive matrix type and the second pixel portion 315 is the active matrix type (see FIG. 6). The first pixel portion 314 is provided over the one surface of the first substrate 311. The first pixel portion 314 includes a first light emitting element 341. The first light emitting element 341 corresponds to a stack of a conductive layer 342, an electroluminescent layer 343, and a conductive layer 344. Insulating layers 345a and 345b are provided between the adjacent first light emitting elements 341. The second pixel portion 315 is provided over the one surface of the second substrate 312. The second pixel portion 315 includes the second light emitting element 332, the driving transistor 336, and the capacitor 337. The space between the first substrate 311 and the second substrate 312 is filled with the sealing resin layer 375.

In the aforementioned structure, the first light emitting element 341 included in the first pixel portion 314 and the second light emitting element 332 included in the second pixel portion 315 both perform bottom light emission. Therefore, a first display using the first pixel portion 314 is provided over the opposite surface of the first substrate 311 and a second display using the second pixel portion 315 is provided over the opposite surface of the second substrate 312.

Further, in the aforementioned structure, an insulating layer 399 is provided over the driving transistor 336 and an insulating layer 300 is provided over the insulating layer 399. In this manner, by stacking insulating layers, a margin for a region where a pixel electrode of the second light emitting element 332 is provided can be expanded and an aperture ratio can be increased. With a high aperture ratio, a driving voltage can be decreased and power consumption can be reduced as an area to emit light increases.

Next, description is made on a sectional structure of the case where the first pixel portion 314 and the second pixel portion 315 are both active matrix type (see FIG. 7). The first pixel portion 314 and the driver circuit 335 are provided over the one surface of the first substrate 311. The first pixel portion 314 includes a first light emitting element 331, a driving transistor 333, and a capacitor 334. The second pixel portion 315 and the driver circuit 338 are provided over the one surface of the second substrate 312. The second pixel portion 315 includes the second light emitting element 332, the driving transistor 336, and the capacitor 337.

Each of the first light emitting element 331 and the second light emitting element 332 includes a pair of conductive layers and an electroluminescent layer. One of the pair of conductive layers included in the first light emitting element 331 also functions as one of the pair of conductive layers included in the second light emitting element 332. That is, the first light emitting element 331 has a structure in which a conductive layer 321, an electroluminescent layer 322, and a conductive layer 323 are stacked. Further, the second light emitting element 332 has a structure in which a conductive layer 325, an electroluminescent layer 324, and a conductive layer 323 are stacked. The first light emitting element 331 and the second light emitting element 332 share the conductive layer 323.

In the aforementioned structure, the first light emitting element 331 included in the first pixel portion 314 and the second light emitting element 332 included in the second pixel portion 315 both perform bottom light emission. Therefore, a first display using the first pixel portion 314 is provided over the opposite surface of the first substrate 311 and a second display using the second pixel portion 315 is provided over the opposite surface of the second substrate 312.

EMBODIMENT MODE 3

Next, description is made on the case where two substrates, each of which is provided with a light emitting element which performs bottom light emission are attached and a connecting film is provided for one of the two substrates (see FIGS. 8A to 9C). A display device in accordance with the invention includes a first substrate 411 and a second substrate 412. The first substrate 411 and the second substrate 412 are provided so that one surface of the first substrate 411 and one surface of the second substrate 412 face each other. The first substrate 411 and the second substrate 412 are attached by a sealing material 416.

A first pixel portion 414 including a first light emitting element is provided over the one surface of the first substrate 411. The first light emitting element included in the first pixel portion 414 emits light in a direction of the opposite surface of the first substrate 411. A second pixel portion 415 including a second light emitting element is provided over the one surface of the second substrate 412. The second light emitting element included in the second pixel portion 415 emits light in a direction of an opposite surface of the second substrate 412.

In the aforementioned structure, the first light emitting element included in the first pixel portion 414 and the second light emitting element included in the second pixel portion 415 both perform bottom light emission. Therefore, a first display using the first pixel portion 414 is provided over the opposite surface of the first substrate 411 and a second display using the second pixel portion 415 is provided over the opposite surface of the second substrate 412.

A connecting film 417, an anisotropic conductive layer 493, and a connecting conductive layer 491 are provided over the one surface of the first substrate 411. The connecting film 417 is connected to a printed substrate 419. The printed substrate 419 is provided with at least one IC chip 420.

Further, a connecting conductive layer 446 is provided over the one surface of the first substrate 411 and a connecting conductive layer 447 is provided over the one surface of the second substrate 412 (see FIGS. 8B to 8D). The connecting conductive layer 446 and the connecting conductive layer 447 are electrically connected through a resin 448 containing a conductive spacer material.

Further, an IC chip 481 is provided over the one surface of the first substrate 411 (see FIG. 8D). The IC chip 481 is attached to the first substrate 411 by the COG method and connected to the first pixel portion 414 and the second pixel portion 415 through an anisotropic conductive layer 480.

The space between the one surface of the first substrate 411 and the one surface of the second substrate 412 is filled with an inert gas 470 (see FIG. 8B). Further, a sealing resin layer 475 may be provided instead of the inert gas 470 (see FIG. 8C). In the case of providing the sealing resin layer 475, it is preferable to provide a spacer material 479 as well as the sealing resin layer 475 in order to keep a distance between the substrates even. Further, a barrier layer may be provided so as to cover a light emitting element. The first substrate 411 and the second substrate 412 are attached by the sealing material 416, however, a sealing material 476 may be provided at edge portions of the first substrate 411 and the second substrate 412 to further enhance the strength of the attachment among the substrates (see FIGS. 8C and 8D).

Figure 9A:
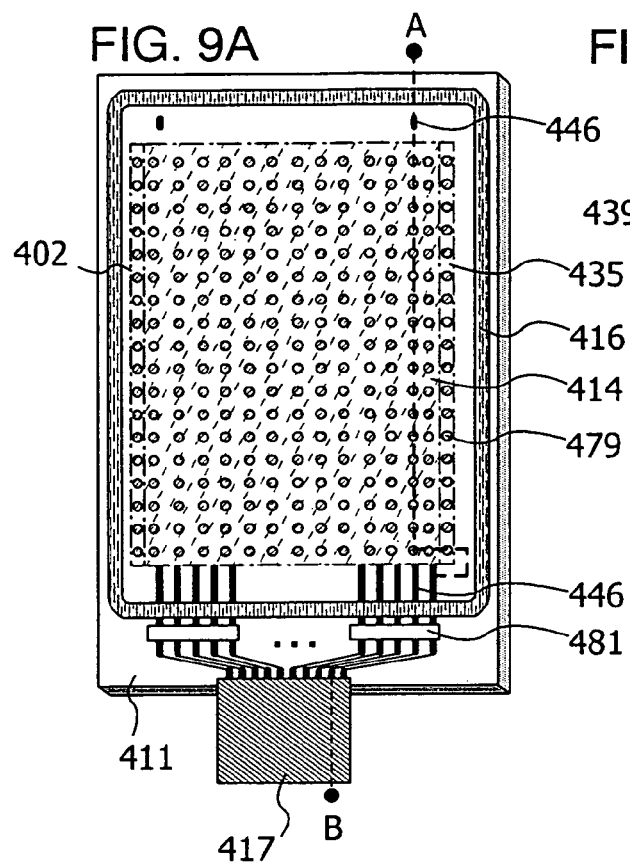
FIGS. 9A to 9C are diagrams, each of which shows a display device of the invention.
Figure 9B:
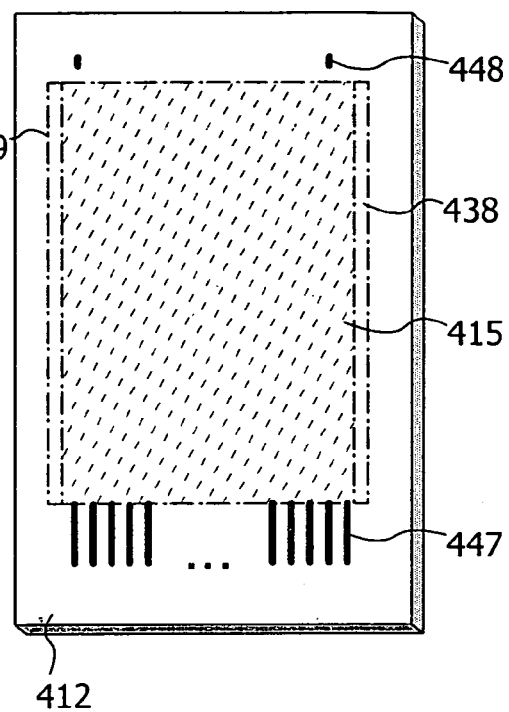
Figure 9C:
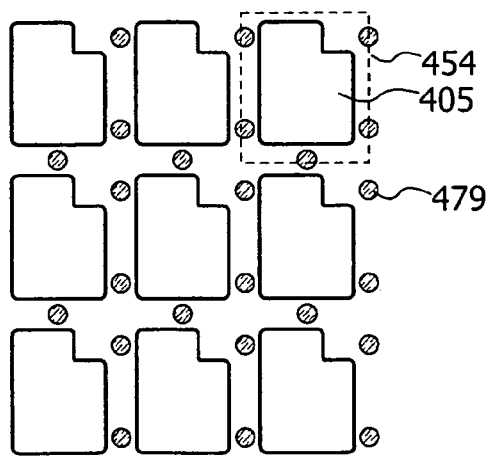

Next, description is made on top plan views of the first substrate 411 and the second substrate 412 with the structure shown in FIG. 8D (see FIGS. 9A and 9B). The first pixel portion 414, the sealing material 416, the connecting conductive layer 446, the spacer material 479, the IC chip 481, a driver circuit 435, and a driver circuit 402 are provided over the first substrate 411. Here, the IC chip 481 functions as a source driver of the first pixel portion 414 and the second pixel portion 415.

The first substrate 411 and the second substrate 412 are attached by forming a resin containing a conductive spacer material over the connecting conductive layer 446 so that the connecting conductive layer 446 over the first substrate 411 and the connecting conductive layer 447 over the second substrate 412 are electrically connected. Further, the spacer material 479 over the first substrate 411 is provided to keep a distance between the first substrate 411 and the second substrate 412 even and is provided at a regular interval over the first pixel portion 414, the driver circuit 435, and the driver circuit 402. In the case of providing the spacer material 479 over the first pixel portion 414, it is preferable to provide the spacer material 479 in a region except for an opening portion 405 of each pixel 454 (see FIG. 9C). The opening portion 405 is a region where a light emitting element is provided. The region except for the opening portion 405 is a region where an insulating layer which functions as a partition is provided.

Next, description is made with reference to the drawings on a detailed sectional structure of a display device with the aforementioned structure (see FIGS. 8A to 9C). It is to be noted that the first pixel portion 414 and the second pixel portion 415 may employ either the active matrix type or the passive matrix type. There are four types of combinations. Hereinafter described are sectional structures of the case where the first pixel portion 414 and the second pixel portion 415 are both active matrix type (see FIG. 10) and the case where the first pixel portion 414 is the passive matrix type and the second pixel portion 415 is the active matrix type (see FIG. 11).

It is to be noted that reference numerals denoting the same portions in FIGS. 8A to 11 are commonly used in different drawings. Hereinafter, descriptions on the portions denoted by the same reference numerals are omitted.

Figure 10:
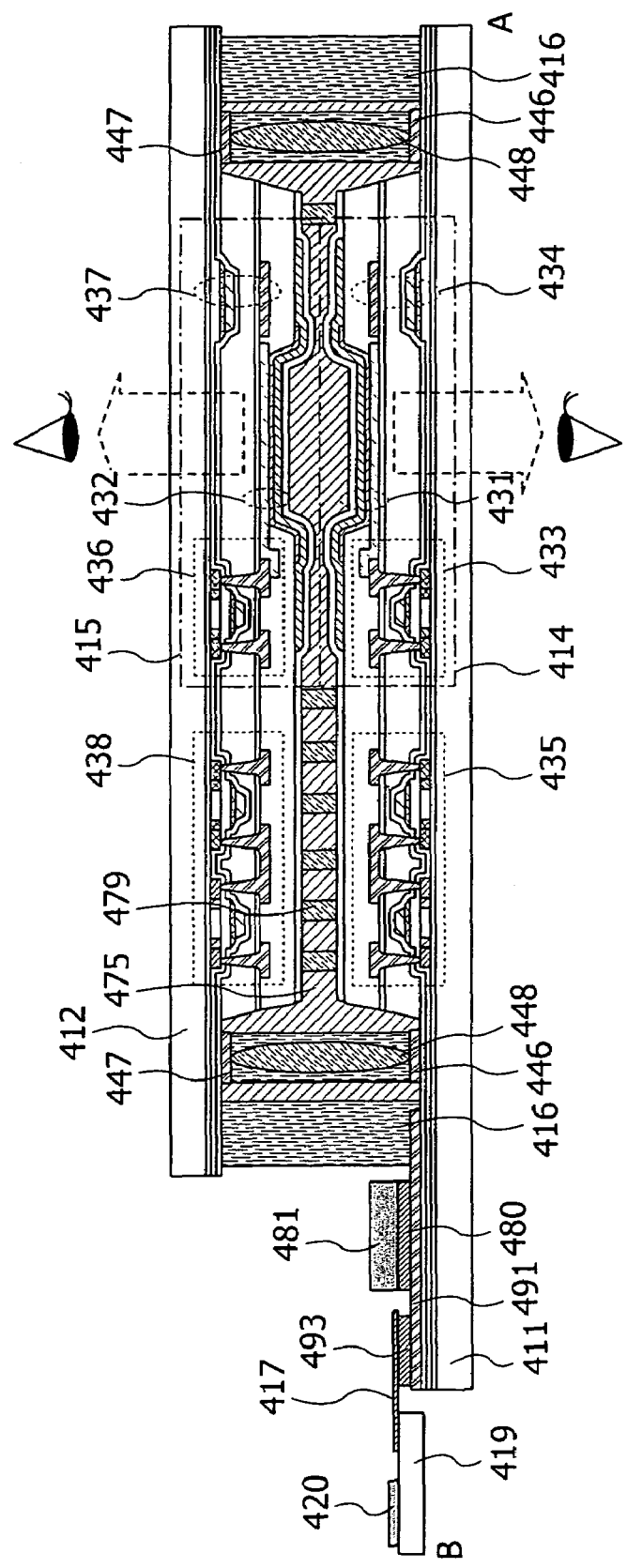
FIG. 10 is a diagram showing a display device of the invention.

First, description is made on a sectional structure of the case where the first pixel portion 414 and the second pixel portion 415 are both active matrix type (see FIG. 10). The first pixel portion 414 and the driver circuit 435 are provided over the one surface of the first substrate 411. The first pixel portion 414 includes a first light emitting element 431, a driving transistor 433, and a capacitor 434. The driver circuit 435 includes an N-type transistor and a P-type transistor connected in series. The second pixel portion 415 and a driver circuit 438 are provided over the one surface of the second substrate 412. The second pixel portion 415 includes a second light emitting element 432, a driving transistor 436, and a capacitor 437. The driver circuit 438 includes an N-type transistor and a P-type transistor connected in series.

In the aforementioned structure, the first light emitting element 431 included in the first pixel portion 414 and the second light emitting element 432 included in the second pixel portion 415 both perform bottom light emission. Therefore, a first display using the first pixel portion 414 is provided over the opposite surface of the first substrate 411 and a second display using the second pixel portion 415 is provided over the opposite surface of the second substrate 412.

Further, the connecting conductive layer 446 is provided over the one surface of the first substrate 411 and the connecting conductive layer 447 is provided over the one surface of the second substrate 412. The connecting conductive layers 446 and 447 are electrically connected through the resin 448 containing a conductive spacer material. The first pixel portion 414 and the driver circuit 435 are supplied with various signals and a power source potential through the connecting film 417.

In the aforementioned structure, the sealing resin layer 475 is provided between the first substrate 411 and the second substrate 412. By providing the sealing resin layer 475, deterioration of the first light emitting element 431 and the second light emitting element 432 can be prevented. Further, short-circuits of the first light emitting element 431 and the second light emitting element 432 can be prevented.

In the aforementioned structure, the spacer material 479 is provided between the first substrate 411 and the second substrate 412. By providing the spacer material 479, a distance between the first substrate 411 and the second substrate 412 can be kept even.

Figure 11:
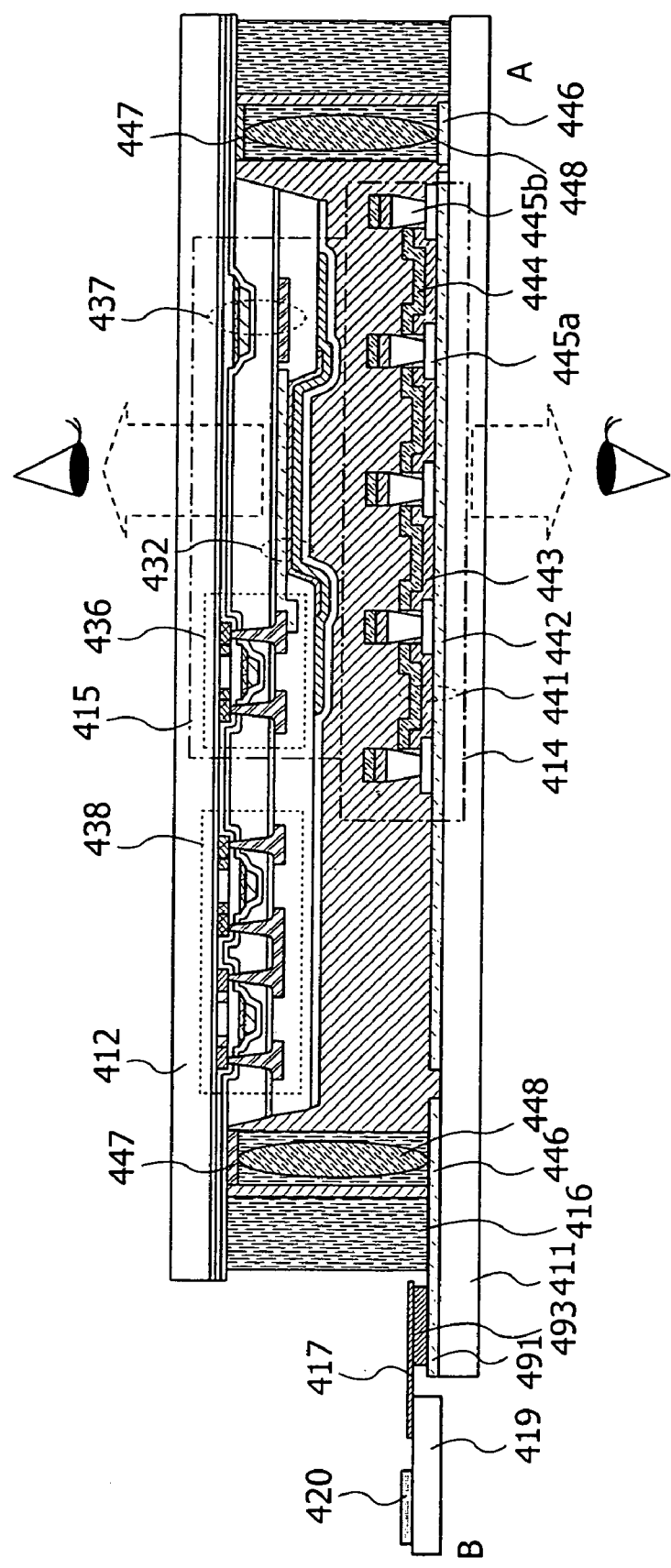
FIG. 11 is a diagram showing a display device of the invention.

Next, description is made on a sectional structure of the case where the first pixel portion 414 is the passive matrix type and the second pixel portion 415 is the active matrix type (see FIG. 11). The first pixel portion 414 is provided over the one surface of the first substrate 411. The first pixel portion 414 includes a first light emitting element 441. The first light emitting element 441 corresponds to a stack of a conductive layer 442, an electroluminescent layer 443, and a conductive layer 444. Insulating layers 445*a* and 445*b* are provided between the adjacent first light emitting elements 441. The second pixel portion 415 is provided over the one surface of the second substrate 412. The second pixel portion 415 includes the second light emitting element 432, the driving transistor 436, and the capacitor 437.

In the aforementioned structure, the first light emitting element 441 included in the first pixel portion 414 and the second light emitting element 432 included in the second pixel portion 415 both perform bottom light emission. Therefore, a first display using the first pixel portion 414 is provided over the opposite surface of the first substrate 411 and a second display using the second pixel portion 415 is provided over the opposite surface of the second substrate 412.

EMBODIMENT MODE 4

A display device in accordance with the invention includes displays provided on the front and back thereof. A structure of the display device can be roughly classified into two types. A first structure is the case of attaching a substrate provided with a light emitting element which performs bottom light emission and a substrate provided with a light emitting element which performs top light emission (see FIGS. 20A to 20D). A second structure is the case of attaching two substrates, each of which is provided with a light emitting element which performs bottom light emission (see FIGS. 23A to 25C). The latter case of attaching two substrates, each of which is provided with a light emitting element which performs bottom light emission can be classified into a case of providing a connecting film for each of the two substrates (see FIGS. 23A and 23B) and a case of providing a connecting film for one of the two substrates (see FIGS. 25A to 25C).

First, description is made on the case of attaching a substrate provided with a light emitting element which performs bottom light emission and a substrate provided with a light emitting element which performs top light emission and providing a connecting film for each of the two substrates (see FIGS. 20A to 20D).

Figure 20A:
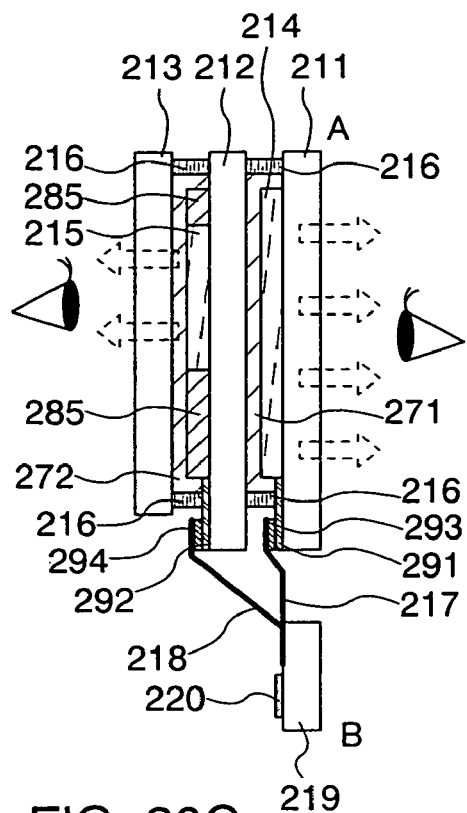
FIGS. 20A to 20D are diagrams, each of which shows a display device of the invention.
Figure 20B:
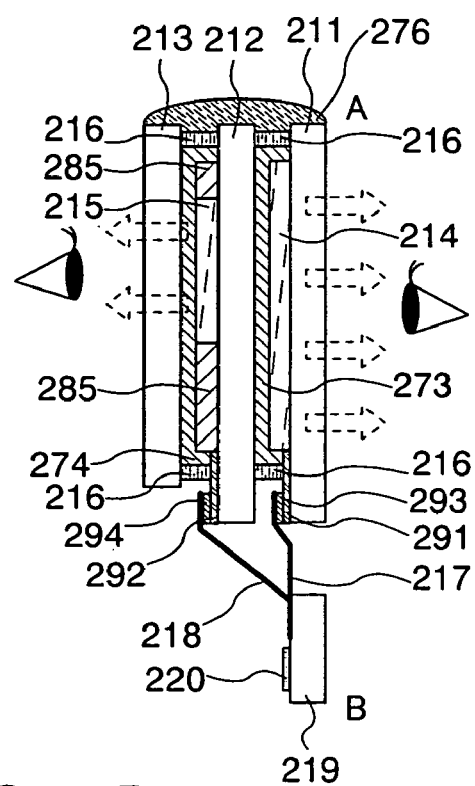

A display device in accordance with the invention includes a first substrate 211, a second substrate 212, and a third substrate 213 (see FIGS. 20A and 20B). The first substrate 211 and the second substrate 212 are provided so that one surface of the first substrate 211 and an opposite surface of the second substrate 212 face each other. The second substrate 212 and the third substrate 213 are provided so that one surface of the second substrate 212 and one surface of the third substrate 213 face each other. Each of the first substrate 211, the second substrate 212, and the third substrate 213 is attached by the sealing material 216.

Figure 20C:
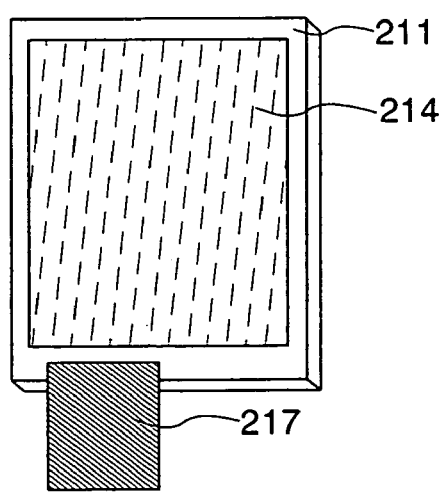
Figure 20D:
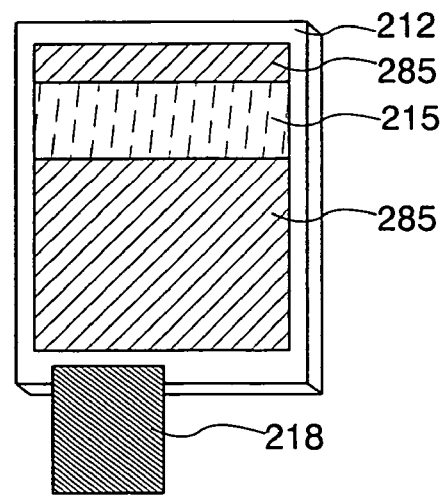

A first pixel portion 214 including a first light emitting element is provided over the one surface of the first substrate 211 (see FIG. 20C). A second pixel portion 215 including a second light emitting element and functional circuit portions 285 including element groups are provided over the one surface of the second substrate 212 (see FIG. 20D). The element group at least includes a plurality of transistors.

The first light emitting element included in the first pixel portion 214 emits light in a direction of the opposite surface of the first substrate 211. The second light emitting element included in the second pixel portion 215 emits light in a direction of an opposite surface of the third substrate 213. That is, the first light emitting element included in the first pixel portion 214 performs bottom light emission and the second light emitting element included in the second pixel portion 215 performs top light emission. A first display using the first pixel portion is provided over the opposite surface of the first substrate 211 and a second display using the second pixel portion is provided over the opposite surface of the third substrate 213.

In a display device in accordance with the invention, the areas of the first pixel portion 214 and the second pixel portion 215 are different from each other. In a display device in accordance with the invention, the areas of the first display using the first pixel portion 214 and the second display using the second pixel portion 215 are different from each other.

In this manner, according to the invention, the areas of the first and second displays are different while the second substrate 212 also functions as a sealing substrate for the first substrate 211, thus an area of the first substrate 211 and an area of the second substrate 212 are the same. In view of this, the functional circuit portion 285 including a plurality of transistors is provided over the second substrate 212 in addition to the second pixel portion 215 in order to efficiently use the second substrate 212.

The functional circuit portion 285 includes a plurality of transistors which form one or a plurality selected from a central processing circuit (CPU, Central Processing Unit), a memory circuit, a buffer circuit, an interface circuit, a timing signal generating circuit, a format converter circuit, a frame memory circuit, an image processing circuit, an audio processing circuit, a transmission/reception circuit, a correction circuit, a time detection circuit, a temperature detection circuit, an illuminance detection circuit, a register circuit, a decoder circuit, a divider circuit, a digital signal processing circuit and the like. By providing the functional circuit portion 285, the number of IC chips which are provided externally can be reduced, and thus a compact, thin, and lightweight display device can be obtained.

Among the circuits which form the functional circuit portion 285, the illuminance detection circuit includes an optical sensor. Therefore, the functional circuit portion 285 is provided with, for example, an image pickup element as an optical sensor in addition to the plurality of transistors. The image pickup element may be either of a photo diode or a photo transistor. As the photo diode, any one of a PN diode, a PIN diode, a Schottky diode, and an avalanche diode may be used. The PIN diode having low junction capacitance is advantageous in that it can provide fast response. Further, the avalanche diode which provides quite a fast response and increases a value of signal, is advantageous in that weak light can be detected.

It is to be noted that in the aforementioned structure, the first pixel portion 214 is provided over the first substrate 211 and the second pixel portion 215 and the functional circuit portions 285 are provided over the second substrate 212. The area of the first display using the first pixel portion 214 is larger than the area of the second display using the second pixel portion 215, however, the invention is not limited to this mode. The functional circuit portions 285 are provided over the first substrate 211 or the second substrate 212. The first pixel portion 214 and the functional circuit portions 285 may be provided over the first substrate 211 and only the second pixel portion 215 may be provided over the second substrate 212. In this case, the area of the first display using the first pixel portion 214 is smaller than the area of the second display using the second pixel portion 215.

Further, in the aforementioned structure, the second pixel operation 215 and the functional circuit portions 285 are provided over the second substrate 212. More specifically, the functional circuit portions 285 are provided in the vicinity of the second pixel portion 215. However, the arrangements of the second pixel portion 215 and the functional circuit portions 285 over the second substrate 212 are not particularly limited.

Further, a first connecting film 217, an anisotropic conductive layer 293, and a connecting conductive layer 291 are provided over the one surface of the first substrate 211. The first connecting film 217 is connected to the first pixel portion 214 through the anisotropic conductive layer 293 and the connecting conductive layer 291. A second connecting film 218, an anisotropic conductive layer 294, and a connecting conductive layer 292 are provided over the one surface of the second substrate 212. The second connecting film 218 is connected to the second pixel portion 215 and the functional circuit portion 285 through the anisotropic conductive layer 294 and the connecting conductive layer 292. The first connecting film 217 and the second connecting film 218 are both connected to a printed substrate 219. The printed substrate 219 is provided with a plurality of IC chips 220. Each of the plurality of IC chips 220 corresponds to one or a plurality selected from a controller circuit, a power source circuit, a central processing circuit and the like. The plurality of IC chips 220 supply signals and a power source potential to the first pixel portion 214, the second pixel portion 215, and the functional circuit portions 285 through the first connecting film 217 or the second connecting film 218.

The space between the one surface of the first substrate 211 and the opposite surface of the second substrate 212 is filled with an inert gas 271 in order to prevent deterioration of a light emitting element. Further, the space between the one surface of the second substrate 212 and the one surface of the third substrate 213 is filled with an inert gas 272 (see FIG. 20A). Each of the inert gases 271 and 272 corresponds to, for example, a noble gas, a nitrogen gas, and the like. It is to be noted that a sealing resin layer 273 may be provided between the one surface of the first substrate 211 and the opposite surface of the second substrate 212 and a sealing resin layer 274 may be provided between the one surface of the second substrate 212 and the one surface of the third substrate 213 instead of the inert gas (see FIG. 20B). It is preferable to use a heat curable resin material and an ultraviolet curable resin material for the sealing resin layers 273 and 274. In the case of providing the sealing resin layers 273 and 274, it is preferable to provide a spacer material as well as the sealing resin layers 273 and 274 in order to keep a distance between the substrates even. Furthermore, a layer (hereinafter sometimes abbreviated as a barrier layer) containing a material having a high barrier property such as a metal oxide and a nitride oxide may be provided as well. In this manner, as a method for preventing deterioration of a light emitting element, any one of or a plurality of a method for filling an inert gas, a method for providing a sealing resin layer, and a method for providing a barrier layer may be used.

Further, the first substrate 211, the second substrate 212, and the third substrate 213 are attached by the sealing material 216, however, a sealing material 276 may be further provided at edge portions of the first substrate 211, the second substrate 212, and the third substrate 213 to further enhance the strength of the attachment among the substrates (see FIG. 20B).

Further, an IC chip may be provided over the one surface of the first substrate 211 and the one surface of the second substrate 212 by the COG method. The IC chip functions as a driver circuit which controls operations of the first pixel portion 214 and the second pixel portion 215. It is to be noted that the IC chip has a thickness of about 20 to 40 µm at the thinnest, while the distance between the two substrates is about 10 µm. Therefore, in the case of providing an IC chip over the one surface of the first substrate 211, it is preferable to appropriately control the distance between the first substrate 211 and the second substrate 212.

Next, description is made with reference to the drawings on a sectional structure of a display device with the aforementioned structure (see FIGS. 20A to 20D). The first pixel portion 214 and the second pixel portion 215 may be either the active matrix type in which a light emitting element and a transistor are provided in each pixel or the passive matrix type in which only a light emitting element is provided in each pixel. There are four types of combinations as described above. Hereinafter, description is made on sectional structures of the case where the first pixel portion 214 and the second pixel portion 215 are both active matrix type (see FIG. 21) and the case where the first pixel portion 214 is the passive matrix type and the second pixel portion 215 is the active matrix type (see FIG. 22).

It is to be noted that reference numerals denoting the same portions in FIGS. 20A to 22 are commonly used in different drawings. Hereinafter, descriptions on the portions denoted by the same reference numerals are omitted.

Figure 21:
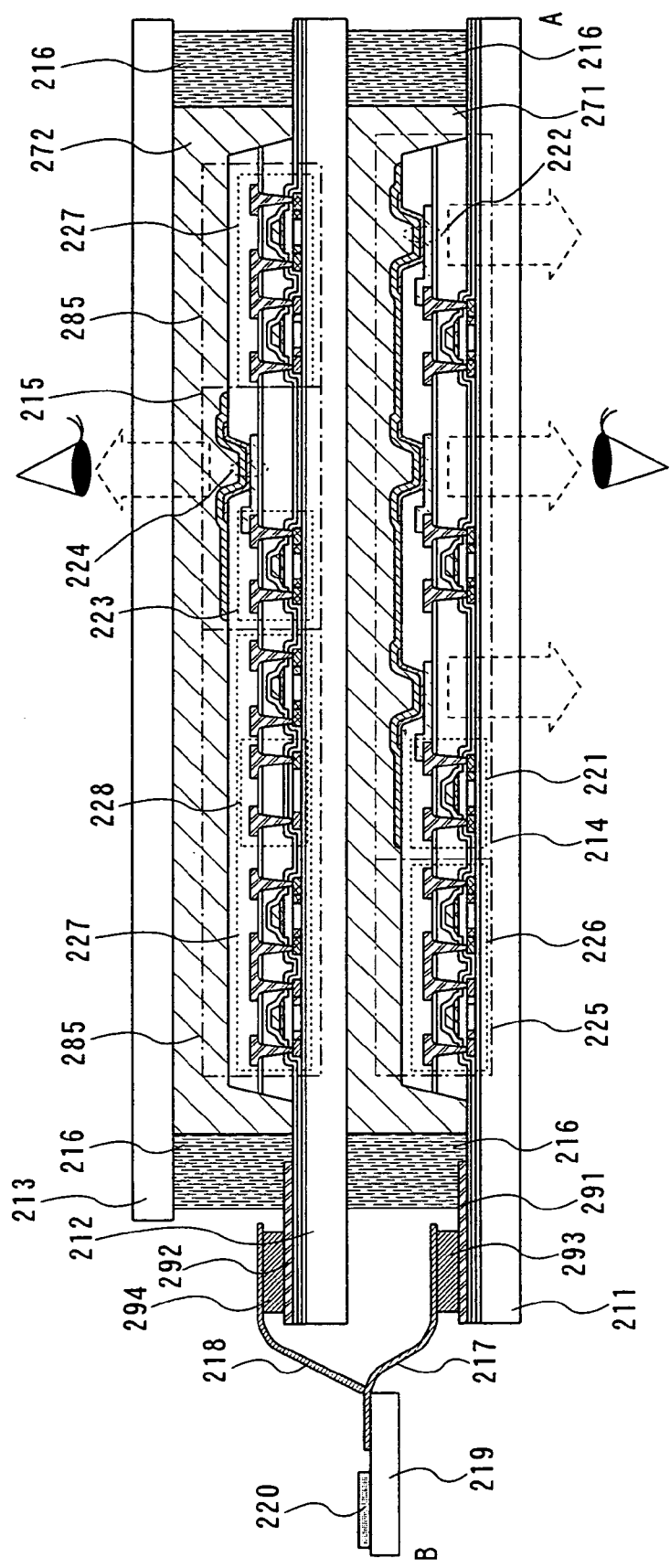
FIG. 21 is a diagram showing a display device of the invention.

First, description is made on a sectional structure of the case where the first pixel portion 214 and the second pixel portion 215 are both active matrix type (see FIG. 21). The first pixel portion 214 and a driver circuit portion 225 are provided over the one surface of the first substrate 211. The first pixel portion 214 includes a first light emitting element 222 and a driving transistor 221. The first light emitting element 222 has a structure in which an electroluminescent layer is sandwiched by a pair of conductive layers. One of the pair of conductive layers of the first light emitting element 222 is connected to a conductive layer which functions as a source wiring or a drain wiring of the driving transistor 221. Further, the driver circuit portion 225 includes an element group 226 including a plurality of transistors. The driver circuit portion 225 which includes a transistor which forms a circuit for controlling an operation of the first pixel portion 214 may be provided as required. Further, the space between the first substrate 211 and the second substrate 212 is filled with the inert gas 271.

The second pixel portion 215 and the functional circuit portions 285 are provided over the one surface of the second substrate 212. The second pixel portion 215 includes a second light emitting element 224 and a driving transistor 223. The second light emitting element 224 has a structure in which an electroluminescent layer is sandwiched between a pair of conductive layers. One of the pair of conductive layers of the second light emitting element 224 is connected to a conductive layer which functions as a source wiring or a drain wiring of the driving transistor 223. Each of the functional circuit portions 285 includes an element group 227 including a plurality of transistors and an image pickup element 228. The space between the second substrate 212 and the third substrate 213 is filled with the inert gas 272.

In the aforementioned structure, the first light emitting element 222 included in the first pixel portion 214 performs bottom light emission and the second light emitting element 224 included in the second pixel portion 215 performs top light emission. Therefore, a first display using the first pixel portion 214 is provided over the opposite surface of the first substrate 211 and a second display using the second pixel portion 215 is provided over the opposite surface of the third substrate 213. The areas of the first and second displays are different from each other.

Figure 22:
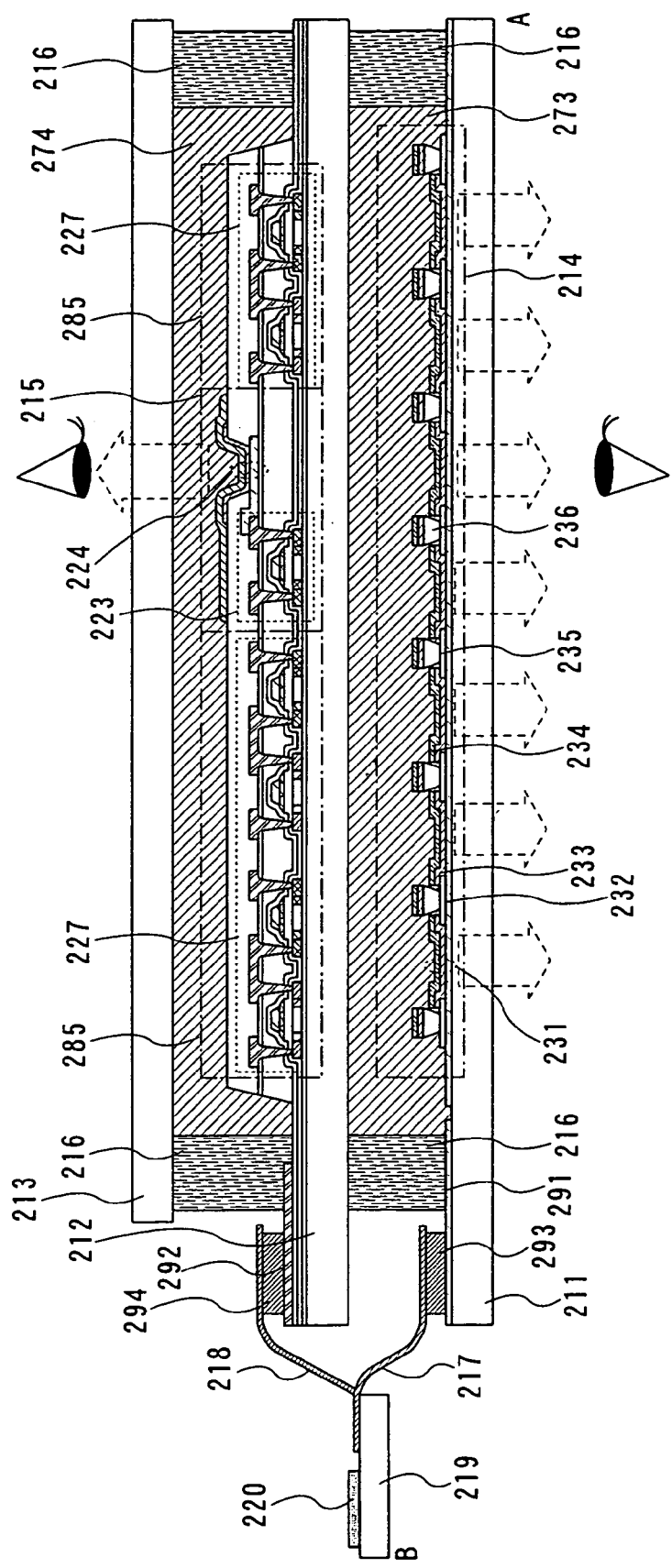
FIG. 22 is a diagram showing a display device of the invention.

Next, description is made on a sectional structure of the case where the first pixel portion 214 is the passive matrix type and the second pixel portion 215 is the active matrix type (see FIG. 22). The first pixel portion 214 is provided over the one surface of the first substrate 211. The first pixel portion 214 includes a first light emitting element 231. The first light emitting element 231 corresponds to a stack of a first conductive layer 232, an electroluminescent layer 233, and a second conductive layer 234. Insulating layers 235 and 236 are provided between the adjacent first light emitting elements 231. The space between the first substrate 211 and the second substrate 212 is filled with a sealing resin layer 273.

The second pixel portion 215 and the functional circuit portions 285 are provided over the one surface of the second substrate 212. The second pixel portion 215 includes the second light emitting element 224 and the driving transistor 223. Each of the functional circuit portions 285 includes an element group 227 including a plurality of transistors. The space between the second substrate 212 and the third substrate 213 is filled with the sealing resin layer 274.

In the aforementioned structure, the first light emitting element 231 included in the first pixel portion 214 performs bottom light emission and the second light emitting element 224 included in the second pixel portion 215 performs top light emission. Therefore, a first display using the first pixel portion 214 is provided over the opposite surface of the first substrate 211 and a second display using the second pixel portion 215 is provided over the opposite surface of the third substrate 213. The areas of the first and second displays are different from each other.

EMBODIMENT MODE 5

Figure 23A:
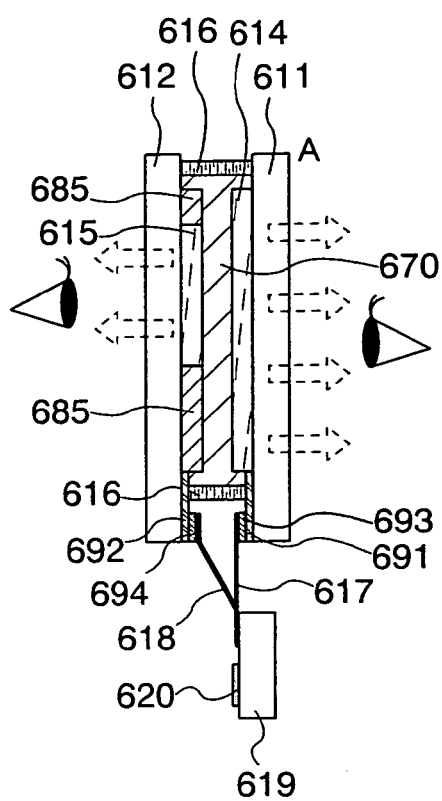
FIGS. 23A and 23B are diagrams, each of which shows a display device of the invention.
Figure 23B:
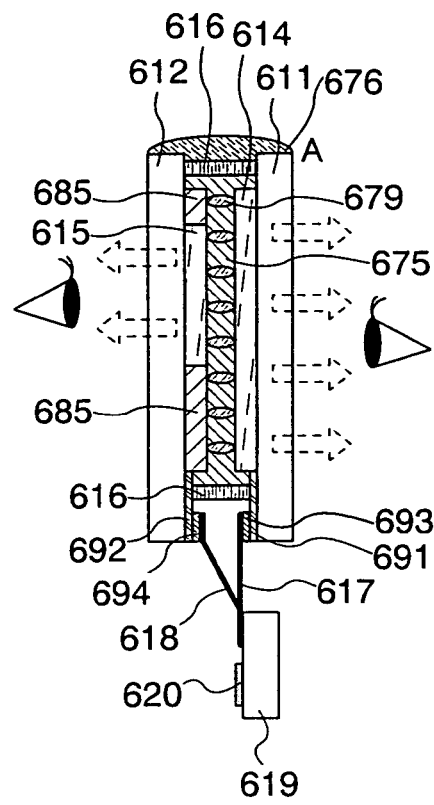

Next, description is made on the case of attaching two substrates, each of which is provided with a light emitting element which performs bottom light emission and providing a connecting film for each of the two substrates (see FIGS. 23A and 23B). A display device in accordance with the invention includes a first substrate 611 and a second substrate 612. The first substrate 611 and the second substrate 612 are provided so that one surface of the first substrate 611 and one surface of the second substrate 612 face each other. The first substrate 611 and the second substrate 612 are attached by a sealing material 616.

A first pixel portion 614 including a first light emitting element is provided over the one surface of the first substrate 611. A second pixel portion 615 including a second light emitting element and functional circuit portions 685 including a plurality of transistors are provided over the one surface of the second substrate 612 (see FIGS. 23A and 23B).

The first light emitting element included in the first pixel portion 614 emits light in a direction of an opposite surface of the first substrate 611. The second light emitting element included in the second pixel portion 615 emits light in a direction of an opposite surface of the second substrate 612. That is, the first light emitting element included in the first pixel portion 614 and the second light emitting element included in the second pixel portion 615 both perform bottom light emission. Therefore, a first display using the first pixel portion 614 is provided over the opposite surface of the first substrate 611 and a second display using the second pixel portion 615 is provided over the opposite surface of the second substrate 612. The areas of the first and second displays are different from each other. A first connecting film 617, an anisotropic conductive layer 693, and a connecting conductive layer 691 are provided over the one surface of the first substrate 611. A second connecting film 618, an anisotropic conductive layer 694, and a connecting conductive layer 692 are provided over the one surface of the second substrate 612. The first connecting film 617 and the second connecting film 618 are both connected to a printed substrate 619. The printed substrate 619 is provided with a plurality of IC chips 620. It is to be noted that a film having connecting terminals over both surfaces (one surface and an opposite surface) may be used as the second connecting film 618. Further, two films each of which has a connecting terminal over one surface thereof and a connector for electrically connecting the two films may be used as the second connecting film 618.

The space between the one surface of the first substrate 611 and the one surface of the second substrate 612 is filled with an inert gas 670 in order to prevent deterioration of a light emitting element (see FIG. 23A). It is to be noted that a sealing resin layer 675 may be provided instead of the inert gas 670 (see FIG. 23B). In the case of providing the sealing resin layer 675, a spacer material 679 may be provided as well as the sealing resin layer 675 in order to keep a distance between the substrates even. Furthermore, a barrier layer may be provided so as to cover the light emitting element. The first substrate 611 and the second substrate 612 are attached by the sealing material 616, however, a sealing material 676 may be provided at edge portions of the first substrate 611 and the second substrate 612 to further enhance the strength of the attachment among the substrates (see FIG. 23).

Further, an IC chip may be provided over one surface of the first substrate 611 and one surface of the second substrate 612 by the COG method. The IC chip functions as a driver circuit which controls operations of the first pixel portion 614 and the second pixel portion 615. It is to be noted that the IC chip has a thickness of about 30 μm at the thinnest, while the distance between the two substrates is about 10 μm. Therefore, in the case of providing an IC chip over the one surface of the first substrate 611 and the one surface of the second substrate 612, it is preferable to appropriately control the distance between the first substrate 611 and the second substrate 612.

Next, description is made with reference to the drawings on a detailed sectional structure of a display device with the aforementioned structure (see FIGS. 23A and 23B). The first pixel portion 614 and the second pixel portion 615 may be either the active matrix type or the passive matrix type. There are four types of combinations as described above. Hereinafter, description is made on a sectional structure of the case where the first pixel portion 614 and the second pixel portion 615 are both active matrix type (see FIG. 24).

Figure 24:
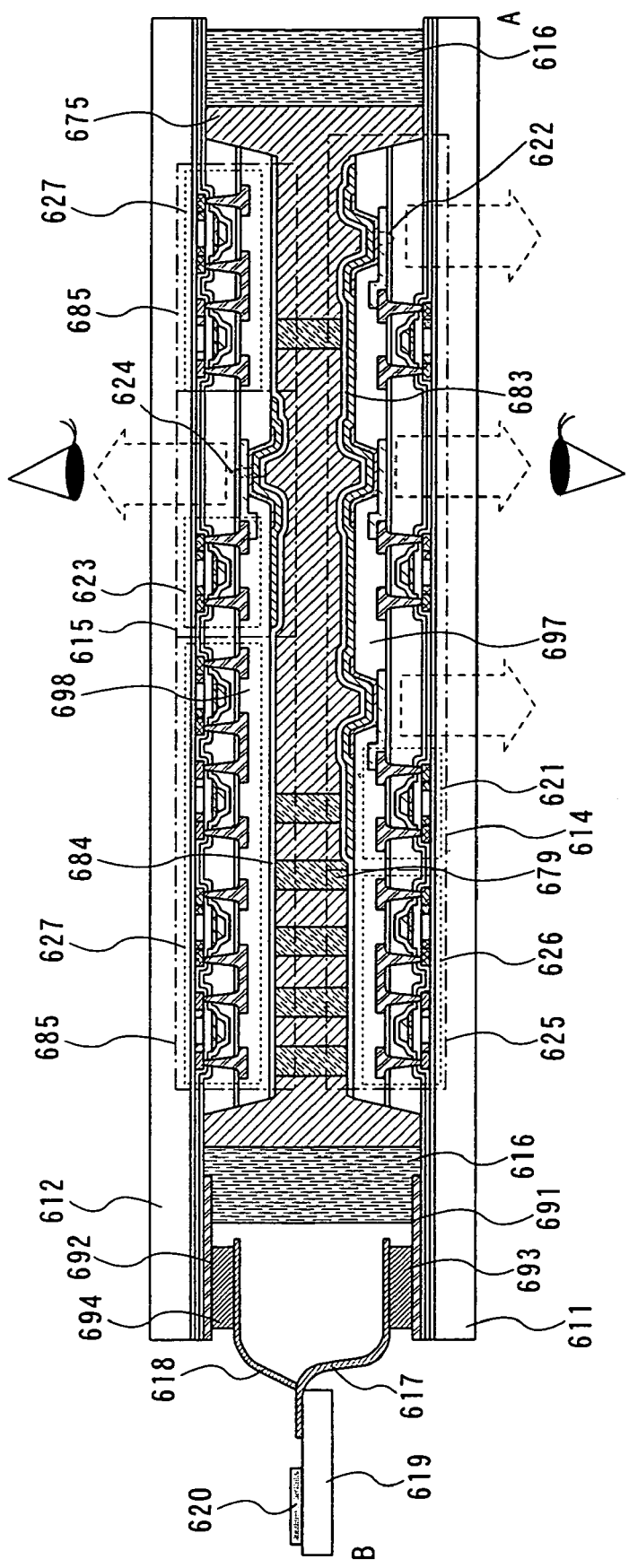
FIG. 24 is a diagram showing a display device of the invention.

It is to be noted that reference numerals denoting the same portions in FIGS. 23A to 24 are commonly used in different drawings. Hereinafter, descriptions on the portions denoted by the same reference numerals are omitted.

The first pixel portion 614 including the first light emitting element and a driver circuit portion 625 are provided over the one surface of the first substrate 611. The first pixel portion 614 includes a first light emitting element 622 and a driving transistor 621. The driver circuit portion 625 includes an element group 626. The second pixel portion 615 including the second light emitting element and functional circuit portions 685 including a plurality of transistors are provided over the one surface of the second substrate 612. The second pixel portion 615 includes a second light emitting element 624 and a driving transistor 623. Each of the functional circuit portions 685 includes an element group 627.

In the aforementioned structure, the first light emitting element 622 included in the first pixel portion 614 and the second light emitting element 624 included in the second pixel portion 615 both perform bottom light emission. Therefore, a first display using the first pixel portion 614 is provided over the opposite surface of the first substrate 611 and a second display using the second pixel portion 615 is provided over the opposite surface of the second substrate 612.

Further, in the aforementioned structure, a barrier layer 683 is provided so as to cover the first light emitting element 622 and a barrier layer 684 is provided so as to cover the second light emitting element 624. Further, a sealing resin layer 675 is provided between the first substrate 611 and the second substrate 612. By providing the barrier layers 683 and 684, and the sealing resin layer 675, deterioration of the first light emitting element 622 and the second light emitting element 624 can be prevented. Further, short-circuits of the first light emitting element 622 and the second light emitting element 624 can be prevented.

In the aforementioned structure, a spacer material 679 is provided between the first substrate 611 and the second substrate 612. By providing the spacer material 679, a distance between the first substrate 611 and the second substrate 612 can be kept even. It is to be noted that the spacer material 679 may be provided between the first substrate 611 and the second substrate 612 as many as required, however, it is preferably provided only over insulating layers 697 and 698 which function as partitions. In the case of providing the spacer material only over the insulating layers 697 and 698 which function as partitions, it is preferable to form the spacer material 679 by a photolithography method.

EMBODIMENT MODE 6

Figure 25A:
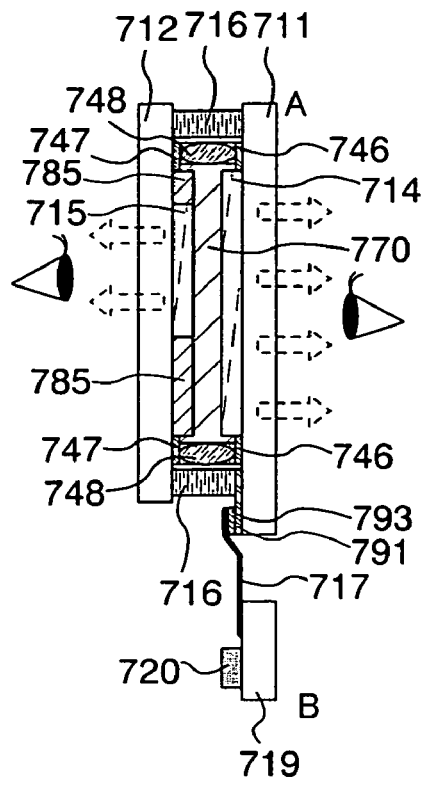
FIGS. 25A to 25C are diagrams, each of which shows a display device of the invention.
Figure 25B:
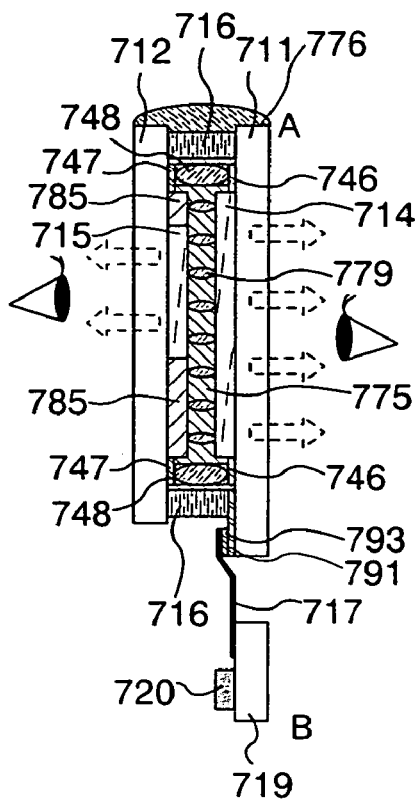
Figure 25C:
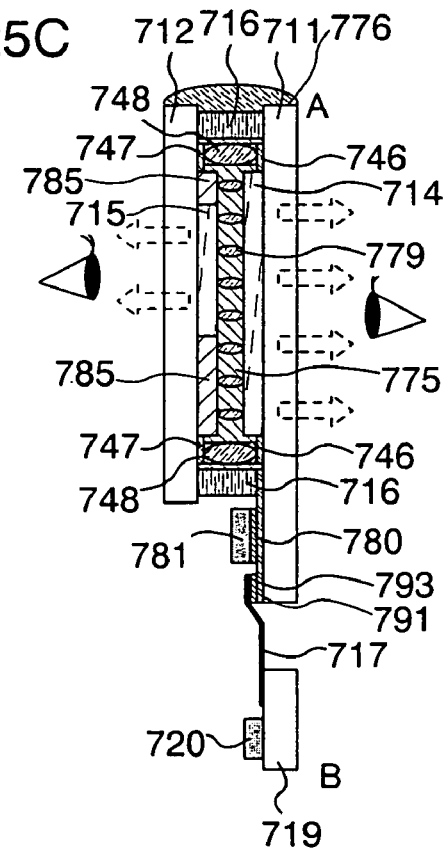

Next, description is made on the case of attaching two substrates, each of which is provided with a light emitting element which performs bottom light emission and providing a connecting film for one of the two substrates (see FIGS. 25A to 25C). A display device in accordance with the invention includes a first substrate 711 and a second substrate 712. The first substrate 711 and the second substrate 712 are provided so that one surface of the first substrate 711 and one surface of the second substrate 712 face each other. The first substrate 711 and the second substrate 712 are attached by a sealing material 716.

A first pixel portion 714 including a first light emitting element is provided over the one surface of the first substrate 711 and a second pixel portion 715 including a second light emitting element and functional circuit portions 785 including a plurality of transistors are provided over the one surface of the second substrate 712.

The first light emitting element included in the first pixel portion 714 emits light in a direction of an opposite surface of the first substrate 711. The second light emitting element included in the second pixel portion 715 emits light in a direction of an opposite surface of the second substrate 712. In the aforementioned structure, the first light emitting element included in the first pixel portion 714 and the second light emitting element included in the second pixel portion 715 both perform bottom light emission. Therefore, a first display using the first pixel portion 714 is provided over the opposite surface of the first substrate 711 and a second display using the second pixel portion 715 is provided over the opposite surface of the second substrate 712. The areas of the first and second displays are different from each other.

A connecting film 717, an anisotropic conductive layer 793, and a connecting conductive layer 791 are provided over the one surface of the first substrate 711. The connecting film 717 is connected to a printed substrate 719. The printed substrate 719 is provided with a plurality of IC chips 720.

Further, a connecting conductive layer 746 is provided over the one surface of the first substrate 711 and a connecting conductive layer 747 is provided over the one surface of the second substrate 712. The connecting conductive layers 746 and 747 are electrically connected by a conductive spacer material 748. The conductive spacer material 748 contains at least a particle spacer material coated with a conductive material (for example, gold), such as a material containing a resin material and a material obtained by coating a surface of a particle spacer material with a conductive material.

Further, an IC chip 781 may be provided over the one surface of the first substrate 711 (see FIG. 25C). The IC chip 781 is attached over the first substrate 711 by the COG method and connected to the first pixel portion 714, the second pixel portion 715, and the functional circuit portion 785 through an anisotropic conductive layer 780.

Further, the space between the one surface of the first substrate 711 and the one surface of the second substrate 712 is filled with an inert gas 770 (see FIG. 25A). However, a sealing resin layer 775 may be provided instead of the inert gas 770 (see FIG. 25B). In the case of providing the sealing resin layer 775, it is preferable to provide a spacer material 779 as well as the sealing resin layer 775 in order to keep a distance between the substrates even. Further, a barrier layer may be provided so as to cover the light emitting element. The first substrate 711 and the second substrate 712 are attached by the sealing material 716, however, a sealing material 776 may be provided at edge portions of the first substrate 711 and the second substrate 712 in order to further enhance the strength of attachment between the substrates (see FIGS. 25B and 25C).

Figure 26A:
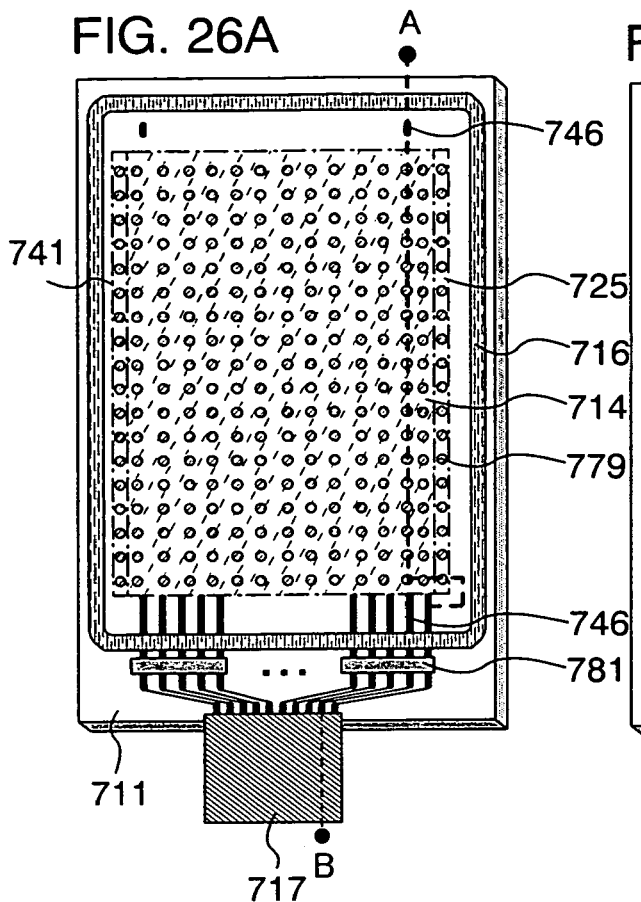
FIGS. 26A to 26C are diagrams, each of which shows a display device of the invention.
Figure 26B:
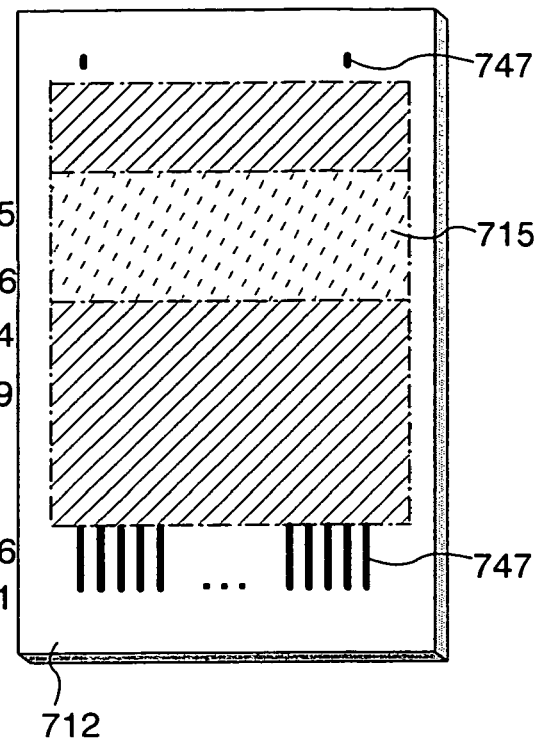

Next, description is made on top plan views of the first substrate 711 and the second substrate 712 with the structure shown in FIG. 25C (see FIGS. 26A and 26B). The first pixel portion 714, the sealing material 716, the connecting conductive layer 746, the spacer material 779, the IC chip 781, and driver circuit portions 725 and 741 are provided over the first substrate 711. The second pixel portion 715 and the connecting conductive layer 747 are provided over the second substrate 712. The IC chip 781 preferably functions as a source driver of the first pixel portion 714 and the second pixel portion 715.

Figure 26C:
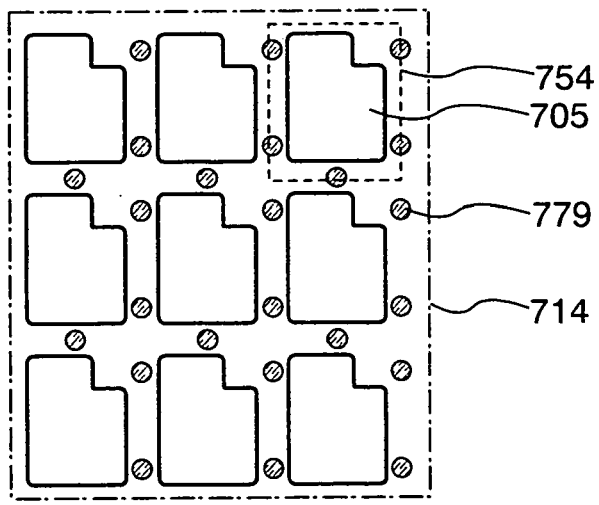

The first substrate 711 and the second substrate 712 are attached by forming a conductive spacer material 748 over the connecting conductive layer 746 so that the connecting conductive layer 746 over the first substrate 711 and the connecting conductive layer 747 over the second substrate 712 are electrically connected. Further, the spacer material 779 over the first substrate 711 is provided to keep a distance between the first substrate 711 and the second substrate 712 even and is provided at a regular interval over the first pixel portion 714, and the driver circuit portions 725 and 741. In the case of providing the spacer material 779 over the first pixel portion 714, it is preferable to provide the spacer material 779 at a regular interval in a region except for an opening portion 705 of each pixel 754 (see FIG. 26C). The opening portion 705 is a region where a light emitting element emits light. The region except for the opening portion 705 is a region where an insulating layer which functions as a partition is provided.

Next, description is made with reference to the drawings on a detailed sectional structure of a display device with the aforementioned structure (see FIGS. 25A to 26C). It is to be noted that the first pixel portion 714 and the second pixel portion 715 may be either the active matrix type or the passive matrix type. There are four types of combinations as described above. Hereinafter described is a sectional structure of the case where the first pixel portion 714 and the second pixel portion 715 are both active matrix type (see FIG. 27).

It is to be noted that reference numerals denoting the same portions in FIGS. 25A to 27 are commonly used in different drawings. Hereinafter, descriptions on the portions denoted by the same reference numerals are omitted.

Figure 27:
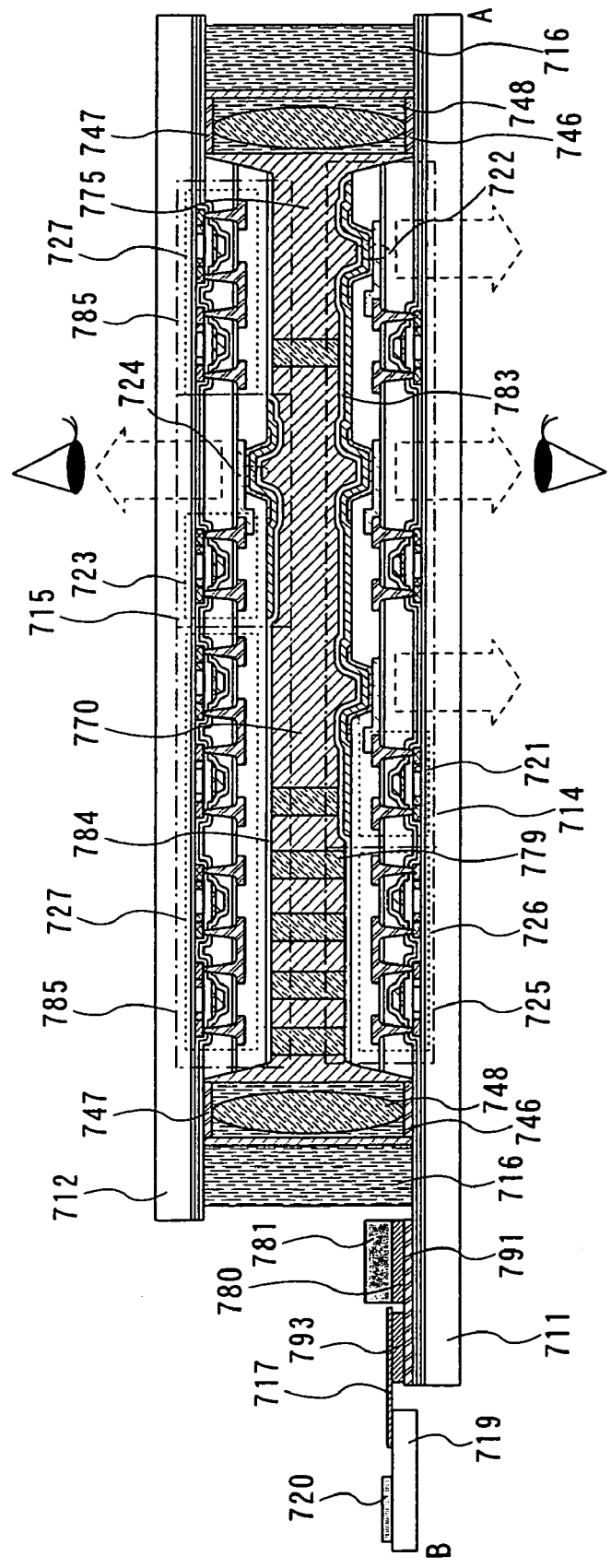
FIG. 27 is a diagram showing a display device of the invention.

First, description is made on a sectional structure of the case where the first pixel portion 714 and the second pixel portion 715 are both active matrix type (see FIG. 27). The first pixel portion 714 and the driver circuit portion 725 are provided over the one surface of the first substrate 711. The first pixel portion 714 includes a first light emitting element 722 and a driving transistor 721. The driver circuit portion 725 includes an element group 726. The second pixel portion 715 and the functional circuit portions 785 are provided over the one surface of the second substrate 712. The second pixel portion 715 includes a second light emitting element 724 and a driving transistor 723. Each of the functional circuit portions 785 includes an element group 727.

In the aforementioned structure, the first light emitting element 722 included in the first pixel portion 714 and the second light emitting element 724 included in the second pixel portion 715 both perform bottom light emission. The first display using the first pixel portion 714 is provided over the opposite surface of the first substrate 711 and the second display using the second pixel portion 715 is provided over the opposite surface of the second substrate 712.

Further, a barrier layer 683 is provided so as to cover the first light emitting element 722 and a barrier layer 684 is provided so as to cover the second light emitting element 624.

The connecting conductive layer 746 is provided over the one surface of the first substrate 711 and the connecting conductive layer 747 is provided over the one surface of the second substrate 712. The connecting conductive layers 746 and 747 are electrically connected through the conductive spacer material 748. The first pixel portion 714 and the driver circuit portion 725 are supplied with various signals and a power source potential through the connecting film 717. The second pixel portion 715 and the functional circuit portion 785 are supplied with various signals and a power source potential through the connecting conductive layer 746, the conductive spacer material 748, the second connecting conductive layer 747, and the connecting film 717.

The sealing resin layer 775 is provided between the first substrate 711 and the second substrate 712. By providing the sealing resin layer 775, deterioration of the first light emitting element 722 and the second light emitting element 724 can be prevented. Further, short-circuits of the first light emitting element 722 and the second light emitting element 724 can be prevented.

EMBODIMENT MODE 7

In the aforementioned structure, the spacer material 779 is provided between the first substrate 711 and the second substrate 712. By providing the spacer material 779, a distance between the first substrate 711 and the second substrate 712 can be kept even.

A display device in accordance with the invention includes the functional circuit portion 285. Hereinafter description is made with reference to the drawings on a configuration example of the functional circuit portion 285.

Figure 28:
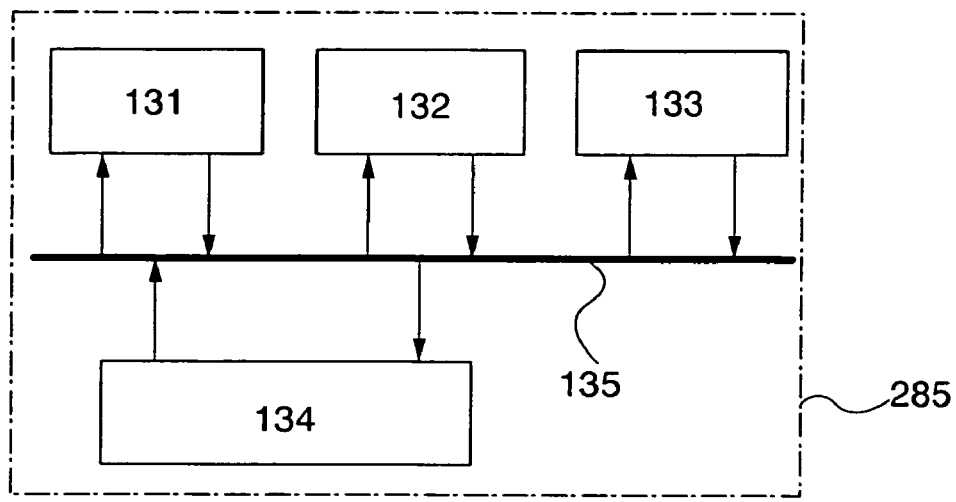
FIG. 28 is a diagram showing a display device of the invention.

The functional circuit portion 285 with a first structure includes memory circuits 131 and 133 formed of a volatile memory such as an SRAM (Static Random Access Memory) and a DRAM (Dynamic Random Access Memory), a central processing circuit 132, an interface circuit 134 which temporarily stores signals and converts the format of signals, and a system bus 135 (see FIG. 28). Various signals supplied from an external device are inputted to the central processing circuit 132 through the interface circuit 134 and the system bus 135. The central processing circuit 132 processes image data and transmits a control signal for a logic circuit to the memory circuit 131. The memory circuit 131 temporarily stores data supplied from the central processing circuit 132. The central processing circuit 132 transmits the processed image data to the memory circuit 133 which then stores the supplied data. The image data stored in the memory 133 is supplied to each pixel through a driver circuit.

Figure 29:
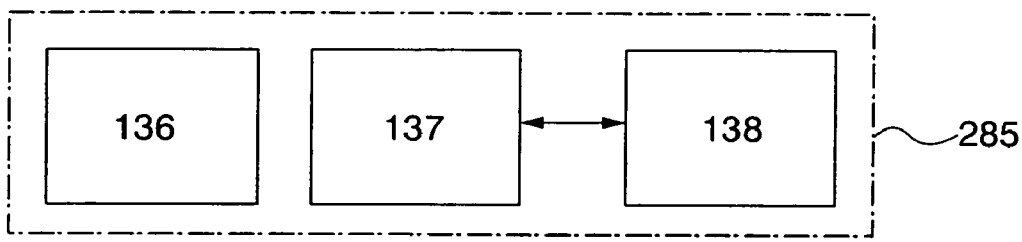
FIG. 29 is a diagram showing a display device of the invention.

The functional circuit portion 285 with a second structure includes a timing signal generating circuit 136 which generates a clock signal and a clock back signal which determine the operating timing of each circuit, a format converter circuit 137 which processes images by converting a compressed and encoded signal and interpolating the image and the like, and a frame memory circuit 138 which stores the image data of which format is converted (see FIG. 29). The image data stored in the memory circuit 138 is supplied to each pixel portion through a driver circuit.

Figure 30:
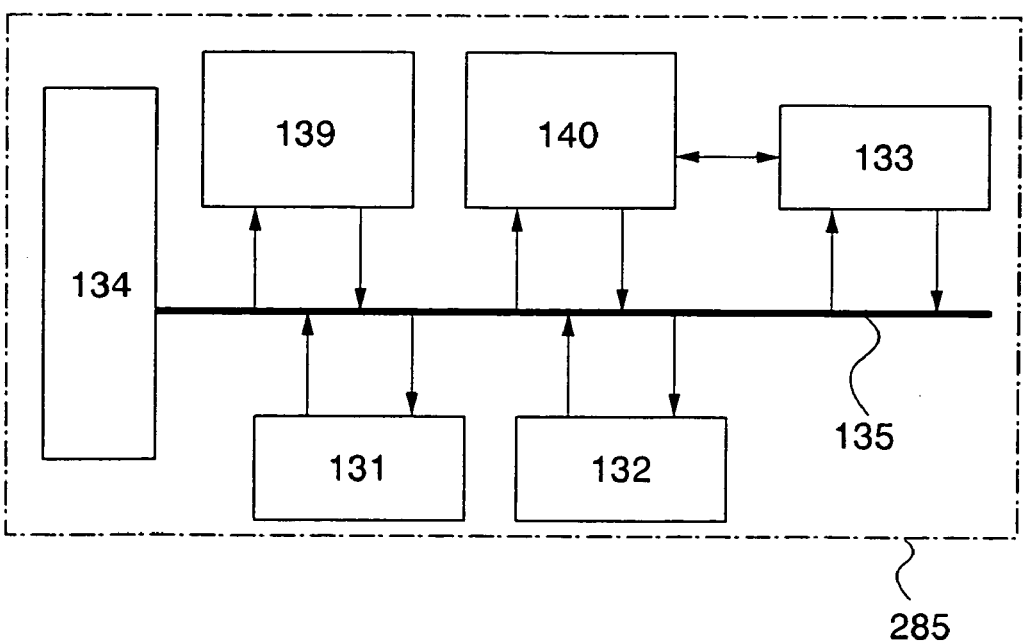
FIG. 30 is a diagram showing a display device of the invention.

The functional circuit portion 285 with a third structure includes the memory circuit 133, a memory circuit 139 which stores program data and image data, an image processing circuit 140, a memory circuit 131, a central processing circuit 132, an interface circuit 134 and a system bus 135 (see FIG. 30). The data stored in the memory circuit 139 is processed by the central processing circuit 132 which processes the data by reading and writing from/to the memory circuit 131. The image processing circuit 140 converts the image data by resizing and the like, thereby the converted image data is stored in the memory circuit 133. The image data stored in the memory circuit 133 is supplied to each pixel portion through a driver circuit.

Each circuit included in the functional circuit portion 285 is formed of a transistor having a semiconductor layer as an active layer. Each circuit is required to operate at a high rate, therefore, it is preferable to use a transistor having a crystalline semiconductor layer as an active layer. A structure of the functional circuit portion 285 is not limited to the aforementioned, but may include one or a plurality selected from a register circuit, a decoder circuit, a counter circuit, a divider circuit, a digital signal processing processor (DSP) and the like. By using a transistor having a crystalline semiconductor layer as an active layer, various circuits can be monolithically formed over an insulating surface. Such a panel requires a small number of peripheral circuits to be connected such as an IC. A system-on-panel in which various circuits are formed over the same substrate as the functional circuit portion 285 can be compact, lightweight, and thin.

EMBODIMENT MODE 8

Figure 12A:
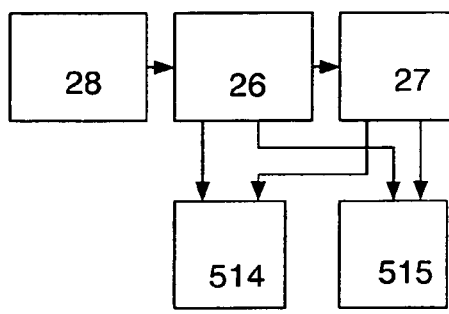
FIGS. 12A to 12D are diagrams, each of which shows a display device of the invention.

Description is made with reference to the drawings on a structure of a display device in accordance with the invention. A display device in accordance with the invention includes a first pixel portion 514, a second pixel portion 515, a controller circuit 26, a power source circuit 27, and a central processing circuit 28 (see FIG. 12A).

The central processing circuit 28 supplies a synchronization signal such as a clock signal and a video signal to the controller circuit 26. The power source circuit 27 supplies a power source potential to the first pixel portion 514 and the second pixel portion 515. The controller circuit 26 generates a clock signal, an inverted clock signal, a start pulse signal, and a latch signal, and converts a video signal based on the signal supplied from the central processing circuit 28. The conversion of video signal is, for example, to convert an analog video signal into a video signal for a time gray scale method. The controller circuit 26 supplies the generated various signals and the converted video signals to the first pixel portion 514 and the second pixel portion 515. Is it to be noted that signals which the controller circuit 26 supplies to each pixel portion are collectively referred to as a control signal in some cases.

Figure 12B:
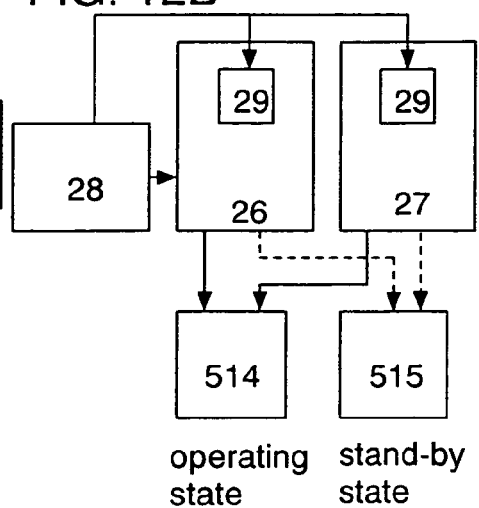
Figure 12C:
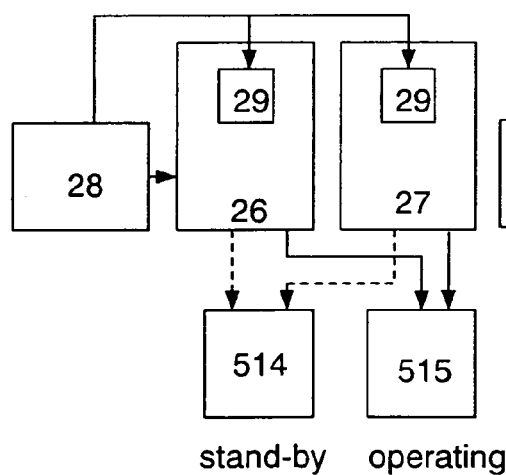
Figure 12D:
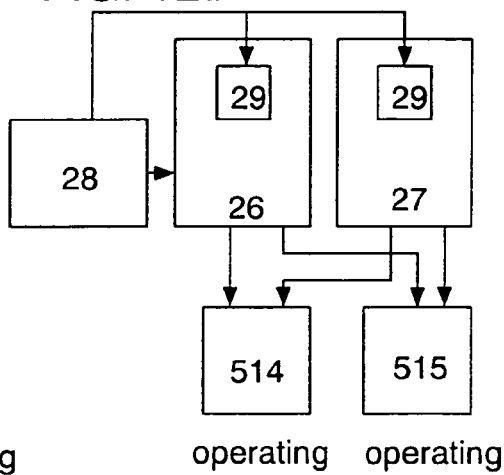

Next, description is made on the case where the first pixel portion 514, the second pixel portion 515, the controller circuit 26, the power source circuit 27, the central processing circuit 28, and a switching circuit 29 are included (see FIGS. 12B to 12D).

First, description is made on an operation of the case where one of the two pixel portions is selected. The central processing circuit 28 outputs to the switching circuit 29 a pixel portion selecting signal which selects one of the two pixel portions. The controller circuit 26 outputs a control signal to one of the first pixel portion 514 and the second pixel portion 515 based on the pixel portion selecting signal outputted to the switching circuit 29 but does not output a control signal to the other. The power source circuit 27 also supplies a power source potential to one of the first pixel portion 514 and the second pixel portion 515 based on the pixel portion selecting signal outputted to the switching circuit 29 but does not supply a power source potential to the other. That is, one of the first pixel portion 514 and the second pixel portion 515 is supplied with a control signal from the controller circuit 26 and also supplied with a power source potential from the power source circuit 27 (also referred to as an operating state) while the other is not supplied with a control signal from the controller circuit 26 and a power source potential from the power source circuit 27 (also referred to as a stand-by state) (see FIGS. 12B and 12C).

Next, description is made on an operation of the case where both of the two pixel portions are selected. The central processing circuit 28 outputs a pixel portion selecting signal which selects the two pixel portions to the switching circuit 29. The controller circuit 26 outputs a control signal to the two pixel portions and the power source circuit 27 supplies a power source potential to the two pixel portions (see FIG. 12D). That is, the two pixel portions are in the operating state.

It is to be noted that each of the controller circuit 26, the power source circuit 27, the central processing circuit 28, and the switching circuit 29 is provided as an IC chip over a printed substrate, however, it is preferable to integrate each circuit with a pixel portion by using an element over a substrate mounting the pixel portion or to attach each circuit as an IC chip to the substrate mounting the pixel portion by the COG method.

In the aforementioned structure, the controller circuit 26 and the power source circuit 27 are shared by the first pixel portion 514 and the second pixel portion 515, therefore, the number of IC chips can be reduced and a compact, thin, lightweight, and inexpensive display device can be realized. This embodiment mode can be freely implemented in combination with the aforementioned embodiment modes.

EMBODIMENT MODE 9

A display device in accordance with the invention includes two pixel portions. Further, a display device in accordance with the invention includes a controller circuit and a power source circuit shared by the two pixel portions. Hereinafter description is made with reference to the drawings on typical four configurations as configuration examples of the pixel portion.

Figure 13:
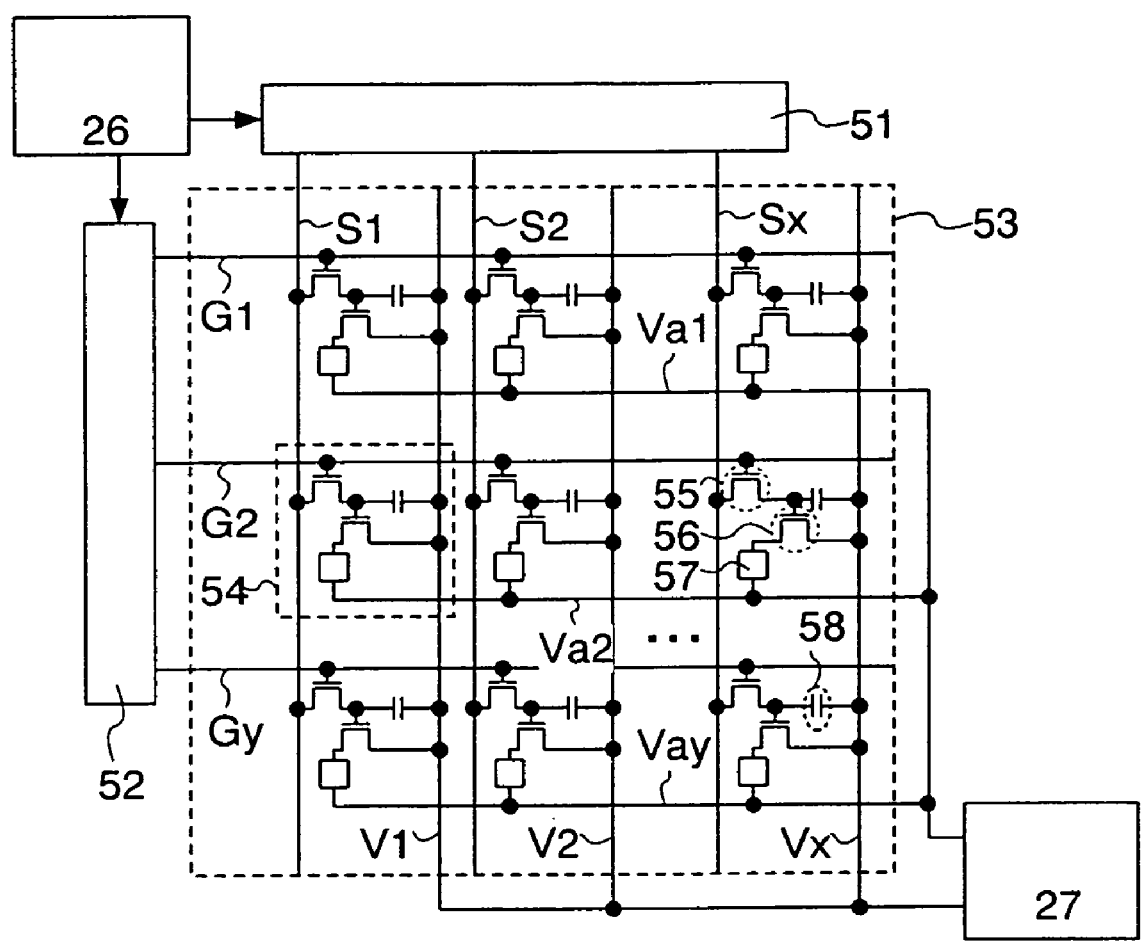
FIG. 13 is a circuit diagram of an active matrix pixel portion.

First, description is made on an active matrix configuration (a pixel including two TFTs) including a light emitting element 57 and two transistors in one pixel 54 (see FIG. 13).

A pixel portion 53 includes a plurality of source lines S1 to Sx (x is a natural number), a plurality of gate lines G1 to Gy (y is a natural number), a plurality of power source lines V1 to Vx, a plurality of power source lines Va1 to Vay, and a plurality of pixels 54. In the periphery of the pixel portion 53, the controller circuit 26, the power source circuit 27, a source driver 51, and a gate driver 52 are provided.

The controller circuit 26 supplies various signals to the source driver 51 and the gate driver 52. The power source circuit 27 supplies a power source potential to the pixel portion 53 through the plurality of power source lines V1 to Vx and the plurality of power source lines Va1 to Vay. The source driver 51 supplies a video signal to each pixel 54 through the plurality of source lines S1 to Sx. The gate driver 52 supplies a gate selecting signal to each pixel 54 through the plurality of gate lines G1 to Gy.

The pixel 54 includes a switching transistor 55 (sometimes referred to as a first transistor) which controls a video signal input to the pixel 54, a driving transistor 56 (sometimes referred to as a second transistor) which controls a current value supplied between opposite electrodes of the light emitting element 57, a capacitor 58 which holds a gate-source voltage (a voltage value between a gate electrode and a source electrode) of the driving transistor 56, and the light emitting element 57. It is to be noted that the capacitor 58 is provided to hold a gate-source voltage of the driving transistor 56. When gate capacitance or parasitic capacitance of the driving transistor 56 can substitute the capacitor 58, the capacitor 58 is not required to be provided.

Figure 14:
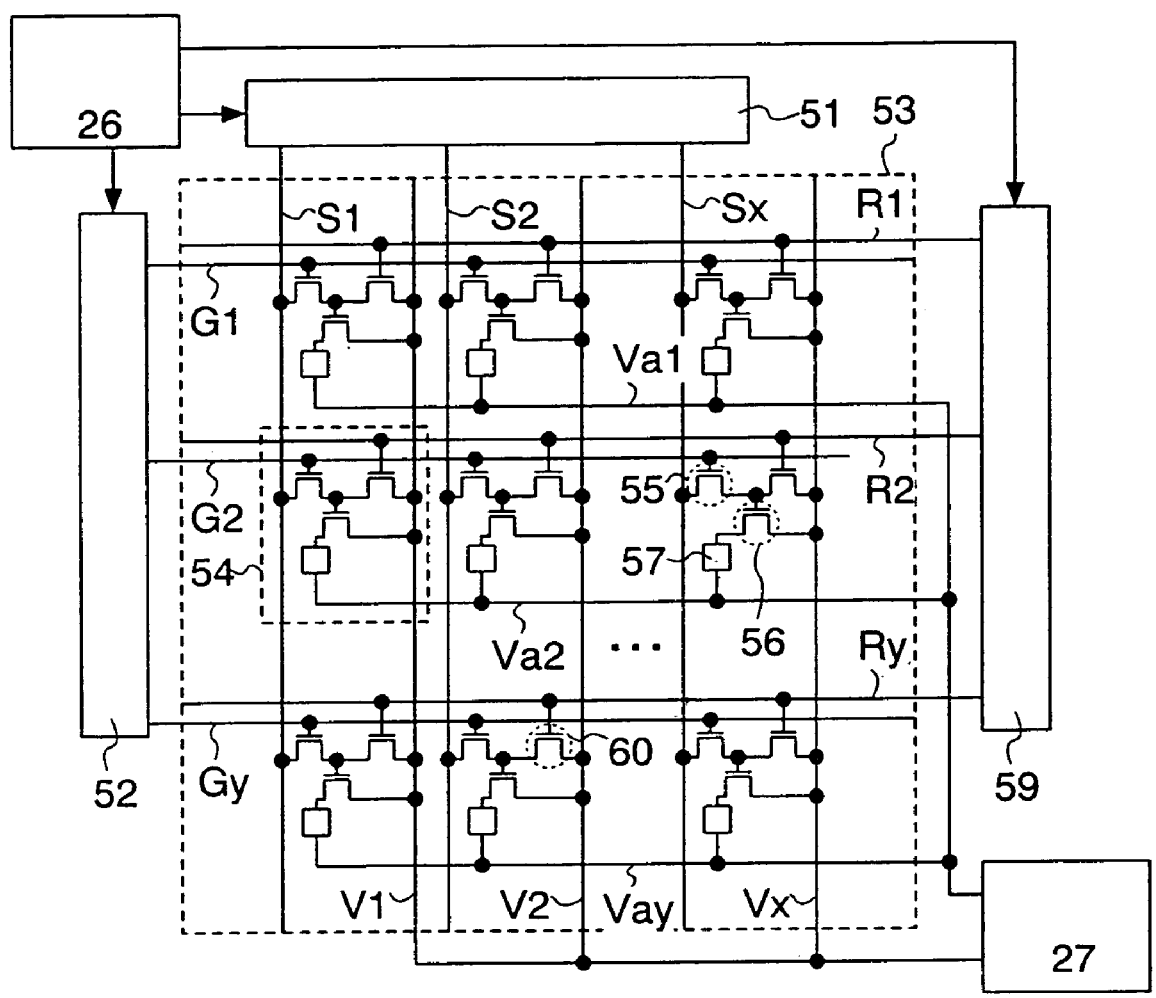
FIG. 14 is a circuit diagram of an active matrix pixel portion.

Next, description is made on an active matrix configuration (a pixel including three TFTs) including the light emitting element 57 and three transistors in one pixel 54 (see FIG. 14).

This configuration is different from the aforementioned configuration (see FIG. 13) in that the capacitor 58 is removed and a plurality of gate lines R1 to Ry, a gate driver 59, and an erasing transistor 60 are additionally provided. The controller circuit 26 is connected to the gate driver 59. Further, the gate driver 59 supplies a gate selecting signal to the pixel portion 53 through the plurality of gate lines R1 to Ry.

The erasing transistor 60 (sometimes referred to as a third transistor) controls on/off state of the driving transistor 56. Light emission of the light emitting element 57 depends on the on/off state of the driving transistor 56, therefore, it is possible to forcibly make a state that a current does not flow to the light emitting element 57, depending on the arrangement of the erasing transistor 60. Therefore, a light emission period can be started at the same time or right after the start of a writing period without waiting for the signals to be written to all pixels. Accordingly, a duty ratio is improved and a moving image can be displayed favorably. It is to be noted that gate capacitance of the driving transistor 56 is used as capacitance for holding a gate-source voltage of the driving transistor 56, therefore, a capacitor is not shown. However, a capacitor may be provided as required.

Figure 15:
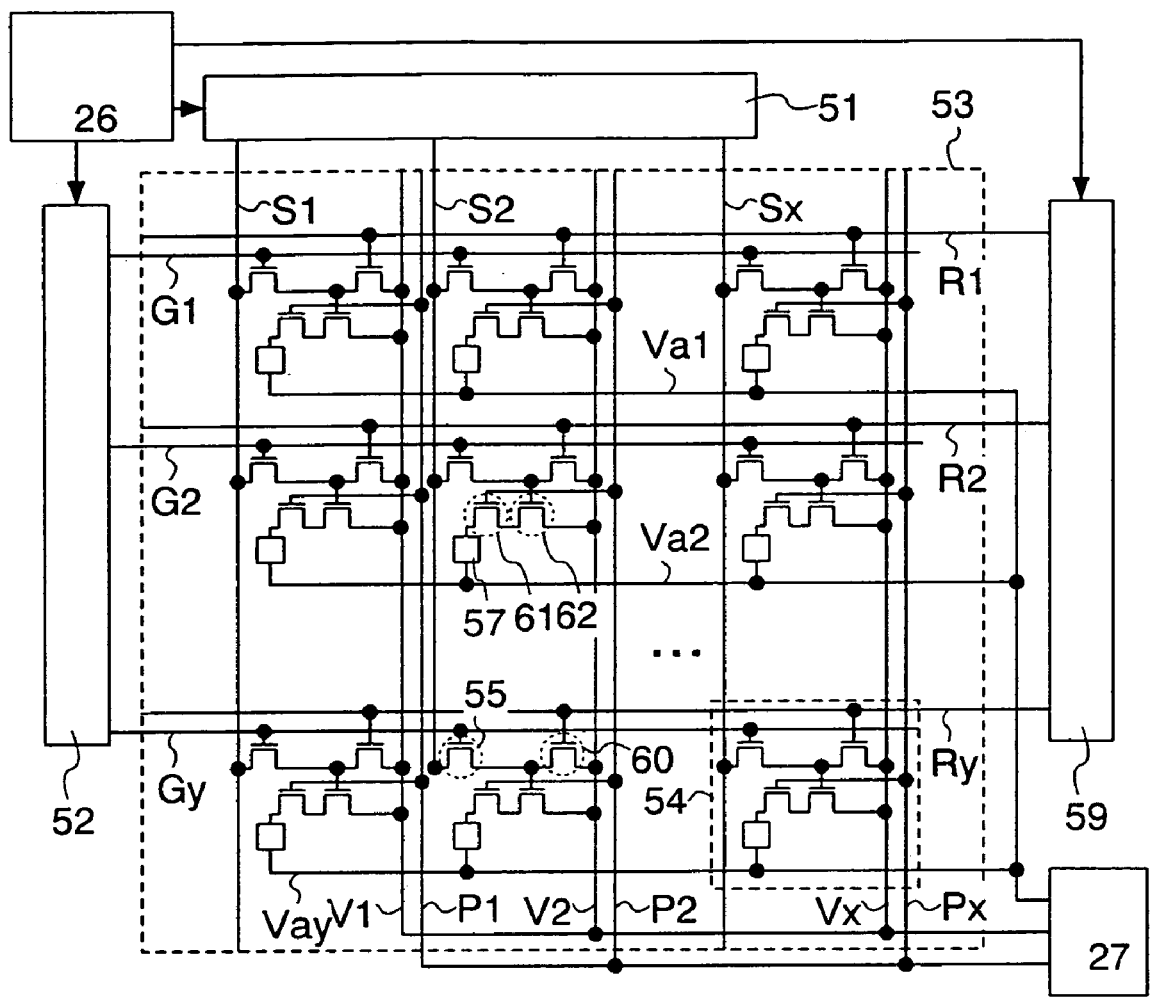
FIG. 15 is a circuit diagram of an active matrix pixel portion.

Next, description is made on an active matrix configuration (a pixel including four TFTs) including the light emitting element 57 and four transistors in one pixel 54 (see FIG. 15).

This configuration is different from the aforementioned configuration (see FIG. 14) in that the driving transistor 56 is removed and a plurality of power source lines P1 to Px, a driving transistor 61, and a current controlling transistor 62 are additionally provided. The power source circuit 27 supplies a power source potential to the pixel portion 53 through the plurality of power source lines P1 to Px.

The driving transistor 61 operates in a saturation region by connecting a gate electrode thereof to a power source line Pm ($1 \leq m \leq x$, m is a natural number) having a fixed potential to fix a potential of the gate electrode thereof. A gate electrode of the current controlling transistor 62 which operates in a linear region connected in series to the driving transistor 61 is inputted with a video signal containing data for light emission or non-light emission of a pixel through the switching transistor 55. As a source-drain voltage of the current controlling transistor 62 is low, slight variation of a gate-source voltage of the current controlling transistor 62 does not affect a current value supplied to the light emitting element 57. Accordingly, the current value supplied to the light emitting element 57 is determined by the driving transistor 61 which operates in the saturation region. It is to be noted that gate capacitance of the driving transistor 56 is used as capacitance for holding a gate-source voltage of the driving transistor 56, therefore, a capacitor is not shown. However, a capacitor may be provided as required.

It is to be noted that conductivity of each of the switching transistor 55, the driving transistor 56, the erasing transistor 60, the driving transistor 61, and the current controlling transistor 62 is not particularly limited and may be either an N-channel type or a P-channel type.

Figure 16:
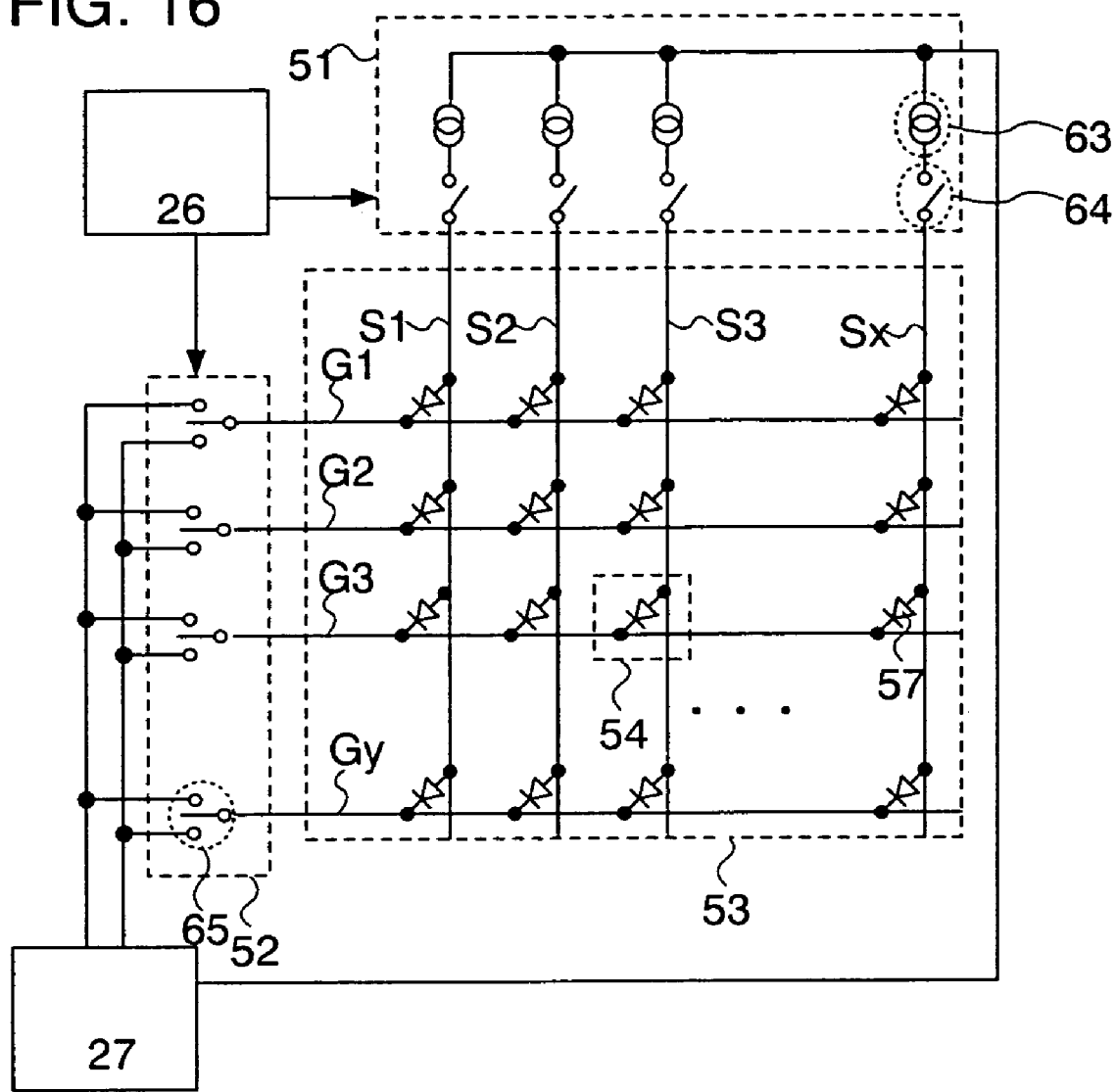
FIG. 16 is a circuit diagram of a passive matrix pixel portion.

Next, description is made on a passive matrix configuration including the light emitting element 57 in one pixel 54 (see FIG. 16).

The pixel portion 53 includes a plurality of source lines S1 to Sx (x is a natural number), a plurality of gate lines G1 to Gy (y is a natural number) and a plurality of pixels 54. Each of the plurality of pixels 54 includes the light emitting element 57. One of a pair of conductive layers of the light emitting element 57 is a conductive layer which forms a source line Sm ($1 \leq m \leq x$) and the other is a conductive layer which forms a gate line Gn ($1 \leq n \leq y$).

The controller circuit 26, the power source circuit 27, the source driver 51, and the gate driver 52 are provided in the periphery of the pixel portion 53. The source driver 51 includes a plurality of constant current sources 63 and a plurality of switches 64. The gate driver 52 includes a plurality of switches 65. One electrode of the light emitting element 57 is connected to the constant current source 63 through the switch 64. Further, the other electrode of the light emitting element 57 is connected to the power source circuit 27 through the switch 65.

It is to be noted that in any of the aforementioned configurations, the pixel portion 53 includes a plurality of the pixels 54, each of which corresponds to any one of a pixel corresponding to red, a pixel corresponding to green, and a pixel corresponding to blue in the case of performing a color display. The arrangement of the pixels may be a stripe arrangement in which a pixel for red, a pixel for green, and a pixel for blue are arranged in a stripe shape, a mosaic arrangement in which pixels for the same color are arranged obliquely, and a delta arrangement in which a pixel for red, a pixel for green, and a pixel for blue are arranged in a triangle shape. The stripe arrangement is suitable for displaying information data such as a line, a figure, and text, while the mosaic and delta arrangements are suitable for displaying image data such as picture images. In the case of using different data between two pixel portions in such a manner that one pixel portion displays information data while the other displays image data, it is preferable to arrange the plurality of pixels in a stripe shape in the pixel portion for displaying information data and to arrange the plurality of pixels in a mosaic shape or a delta shape in the pixel portion for displaying image data.

Further, in the case of performing color display, groups of three pixels for red, green, and blue are provided in matrix, however, the invention is not limited to this configuration. The groups of four pixels for red, green, blue, and white may be provided in matrix. This embodiment mode can be freely implemented in combination with the aforementioned embodiment modes.

EMBODIMENT MODE 10

A display device in accordance with the invention includes two pixel portions and has displays on the front and back thereof. A video signal supplied to each of a first pixel portion and a second pixel portion is not particularly limited and may be either an analog video signal or a digital video signal. There are four types of combinations to supply the video signals. First is the case of supplying analog video signals to both of the first pixel portion and the second pixel portion, second is the case of supplying analog video signals to the first pixel portion and supplying digital video signals to the second pixel portion, third is the case of supplying digital video signals to the first pixel portion and supplying analog video signals to the second pixel portion, and fourth is the case of supplying digital video signals to both of the first pixel portion and the second pixel portion.

Among the aforementioned combinations, for example, digital video signals may be supplied to a main pixel portion which mainly displays moving images and high resolution images so as to perform a digital display while analog video signals may be supplied to a sub-pixel portion which mainly displays still images such as text data and figure data so as to perform an analog display. The pixel portion which performs the analog display is less frequently written signals, therefore, power consumption of a source driver can be suppressed. Further, as the signals are less frequently written, the frequency of the source driver can be lower, thereby video signals can be accurately written.

Further, there are video signals using voltage and video signals using current. That is, video signals inputted to a pixel when a light emitting element emits light are constant voltage signals or constant current signals. The constant voltage video signals may be video signals which supply a constant voltage to the light emitting element or video signals which supply a constant current to the light emitting element. The constant current video signals may be video signals which supply a constant voltage to the light emitting element or video signals which supply a constant current to the light emitting element. When a constant voltage is supplied to the light emitting element, it is referred to as a constant voltage drive and when a constant current is supplied to the light emitting element, it is referred to as a constant current drive. The constant current drive supplies a constant current to the light emitting element independently of changes in resistance of the light emitting element.

Each pixel portion may be supplied with either voltage video signals or current video signals. There are four types of combinations. First is the case of supplying voltage video signals to both of the first pixel portion and the second pixel portion, second is the case of supplying voltage video signals to the first pixel portion and supplying current video signals to the second pixel portion, third is the case of supplying current video signals to the first pixel portion and supplying voltage video signals to the second pixel portion, and fourth is the case of supplying current video signals to both of the first pixel portion and the second pixel portion.

Further, each pixel portion may employ either of the constant voltage drive and the constant current drive. There are four types of combinations. First is the case where both of the first pixel portion and the second pixel portion employ the constant voltage drive, second is the case where the first pixel portion employs the constant voltage drive and the second pixel portion employs the constant current drive, third is the case where the first pixel portion employs the constant current drive and the second pixel portion employs the constant voltage drive, and fourth is the case where both of the first pixel portion and the second pixel portion employ the constant current drive.

Further, each of the first pixel portion and the second pixel portion includes a plurality of pixels, however, the number of pixels included in each pixel portion is not required to be the same and each pixel portion may include the different number of pixels. A pixel pitch of each pixel portion is not required to be the same and each pixel portion may have a different pixel pitch. Further, a display area of each pixel portion is not required to be the same and each pixel portion may have a different display area. Further, the number of gray scale levels of an image to be displayed by each pixel portion is not required to be the same, and each pixel portion may display the different number of gray scale levels.

A display device in accordance with the invention includes a light emitting element. The pixel portion performs a color display or a monochrome display depending on a material used for an electroluminescent layer of the light emitting element, and the use of a color filter and a color conversion layer.

First, in the case where the light emitting element emits red, green, or blue light, the pixel portion performs a color display. In the case where the light emitting element emits white light and a color filter is provided, the pixel portion performs a color display. In the case where the light emitting element emits white light and a color filter is not provided, the pixel portion performs a monochrome display. In the case where the light emitting element emits blue light and a color conversion layer is provided, the pixel portion performs a color display. In the case where the light emitting element emits blue light and a color conversion layer is not provided, the pixel portion performs a monochrome display. In the case where the light emitting element emits light of one of red, green, and the like, the pixel portion performs a monochrome display.

In the case where the light emitting element emits red, green, or blue light, light utilization efficiency is improved as an optical film is not required to be used. Further, in the case where the light emitting element emits white or blue light, the yield can be improved as an electroluminescent layer is not required to be separately deposited. In the case where a color filter or a color conversion layer is provided, color purity and a contrast are improved.

A light emitting element may be a stacked-layer type in which the electroluminescent layer is formed of a plurality layers, a single layer type in which the electroluminescent layer is formed of one layer, and a mixed type in which the electroluminescent layer is formed of a plurality of layers but a boundary between them is not clear. Further, there are a forward stacking structure in which a first conductive layer corresponding to an anode, an electroluminescent layer over the first conductive layer, and a second conductive layer corresponding to a cathode over the electroluminescent layer are stacked in this order from the bottom, and an inversely stacking structure in which a first conductive layer corresponding to a cathode, an electroluminescent layer over the first conductive layer, and a second conductive layer corresponding to an anode over the electroluminescent layer are stacked in this order from the bottom. The light emitting element may employ an appropriate structure according to the conductivity of a transistor for driving the light emitting element and a direction of current flowing through the light emitting element. The electroluminescent layer may be formed of an organic material (low molecular weight, high molecular weight, and medium molecular weight), an inorganic material, a singlet material, a triplet material, or a material in which one or a plurality selected from the aforementioned four materials are mixed. The light emitted from the light emitting element includes light emission (fluorescence) which occurs when returning from a singlet exciton state to a base state and light emission (phosphorescence) which occurs when returning from a triplet exciton state to the base state. The invention employs one or both of these light emissions. The light emitting element is suitable for displaying moving images as a wide viewing angle, a thin design and lightweight are realized without requiring a backlight and a fast response can be provided. By using a light emitting element having the aforementioned advantages, a display device in which a high function and a high added value are realized can be provided. This embodiment mode can be freely implemented in combination with the aforementioned embodiment modes.

EMBODIMENT MODE 11

Figure 17:
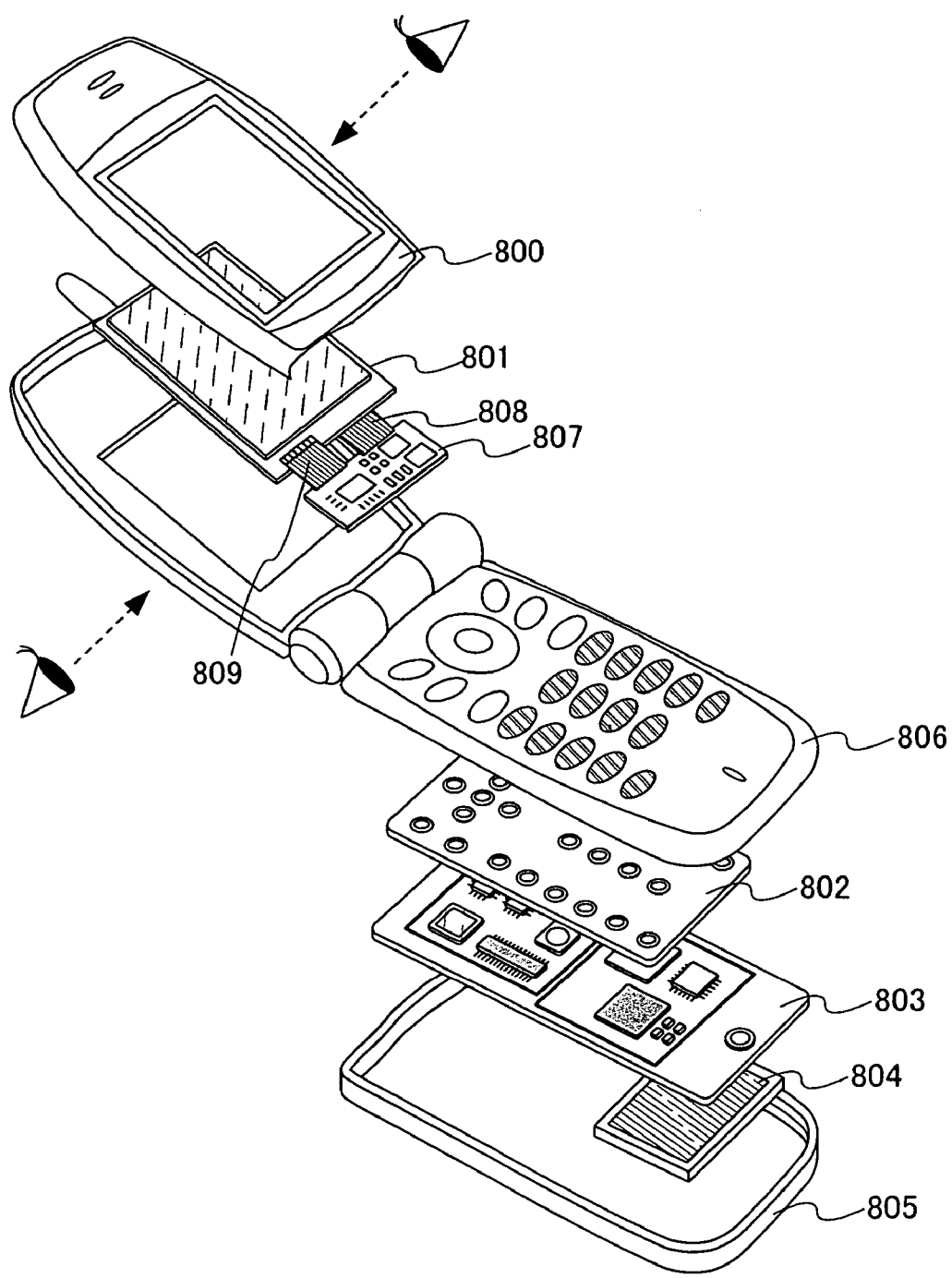
FIG. 17 is a view showing an electronic device using a display device of the invention.

Description is made with reference to the drawings on electronic devices using a display device in accordance with the invention. An electronic device includes a housing 800, a housing 805, a housing 806, a panel 801, an operating button 802, a printed substrate 803, a printed substrate 807, a battery 804, a connecting film 808, and a connecting film 809 (see FIG. 17). The panel 801 includes pixel portions on the front and back thereof. Each pixel portion is connected to the printed substrate 807 through the connecting film 808 or 809. A plurality of IC chips are mounted on the printed substrate 807. The IC chips correspond to one or a plurality selected from a controller, a central processing circuit, a memory, a power source circuit, an image processing circuit, an audio processing circuit, a transmission/reception circuit, a time detection circuit, a correction circuit, a temperature detection circuit and the like. The panel 801, the operating button 802, the printed substrates 803 and 807, the battery 804, the connecting films 808 and 809 are stored in the housings 800, 805, and 806. Each pixel portion included in the panel 801 is arranged so that it can be seen from an open window provided in the housings 800 and 806.

It is to be noted that the housings 800, 805, and 806 only show an example of an exterior shape of a portable phone. An electronic device according to this embodiment mode can have various modes according to a function and an application thereof. Therefore, hereinafter description is made with reference to FIGS. 18A to 19D on examples of modes of electronic devices.

Figure 18A:
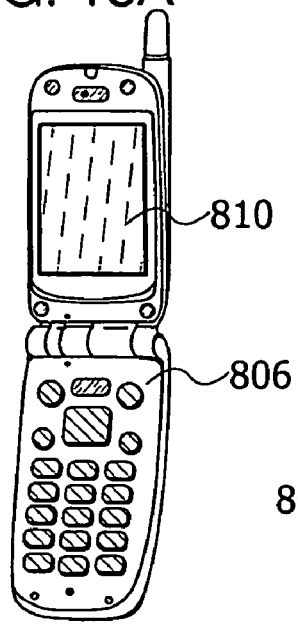
FIGS. 18A to 18G are views, each of which shows an electronic device using a display device of the invention.
Figure 18B:
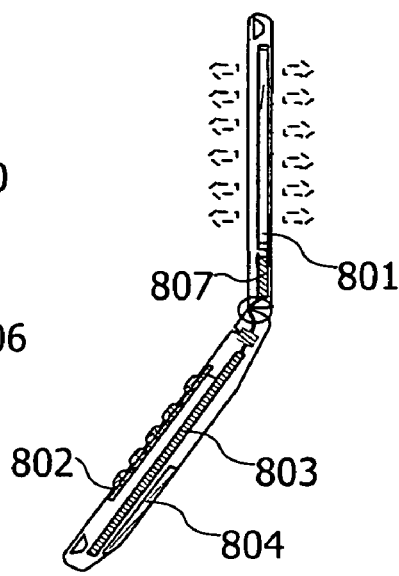
Figure 18C:
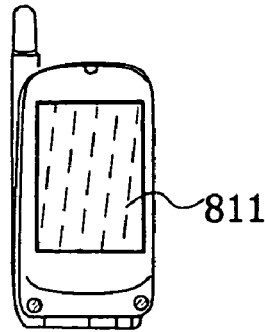

A portable phone includes the panel 801, the operating button 802, the printed substrates 803 and 807, the battery 804, the housing 806, a display 810, a display 811, and the like (see FIGS. 18A to 18C). The display 810 is used when the portable phone is open (see FIG. 18A) and the display 811 is used when the portable phone is folded (see FIG. 18C). The invention can be applied to a display device having the display 810 and the display 811.

Figure 18D:
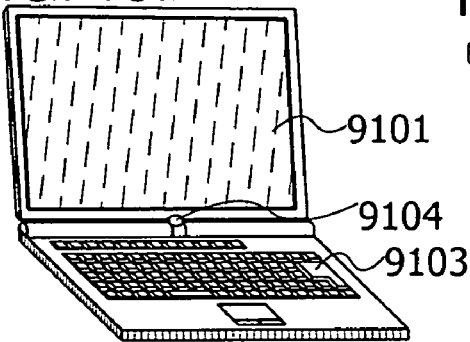
Figure 18E:
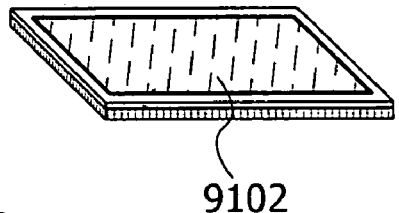

A portable information terminal includes a display 9101, a display 9102, a button 9103, a rotation axis 9104 and the like (see FIGS. 18D and 18E). In the portable information terminal, the display 9101 is used when the portable information terminal is open and the display 9102 is used when the portable information terminal is folded. In both the open and folded states, both the display 9101 and display 9102 can be used by rotating the housing using the rotation axis 9104. The invention can be applied to a display device including the display 9101 and the display 9102.

Figure 18F:
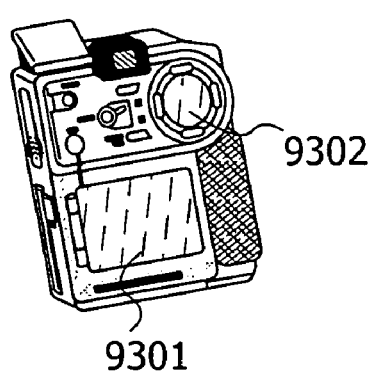
Figure 18G:
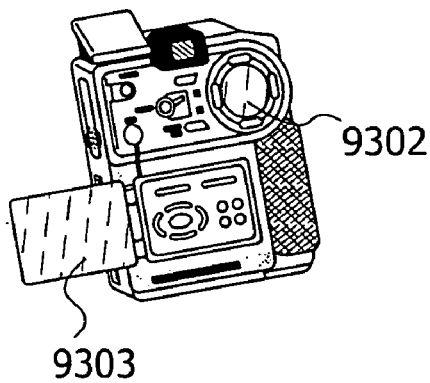
Figure 19A:
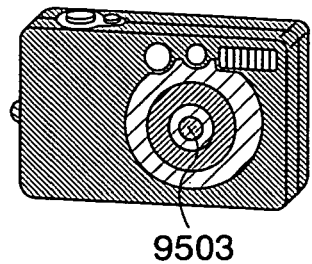
FIGS. 19A to 19D are views, each of which shows an electronic device using a display device of the invention.
Figure 19B:
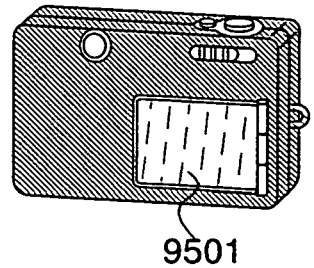
Figure 19C:
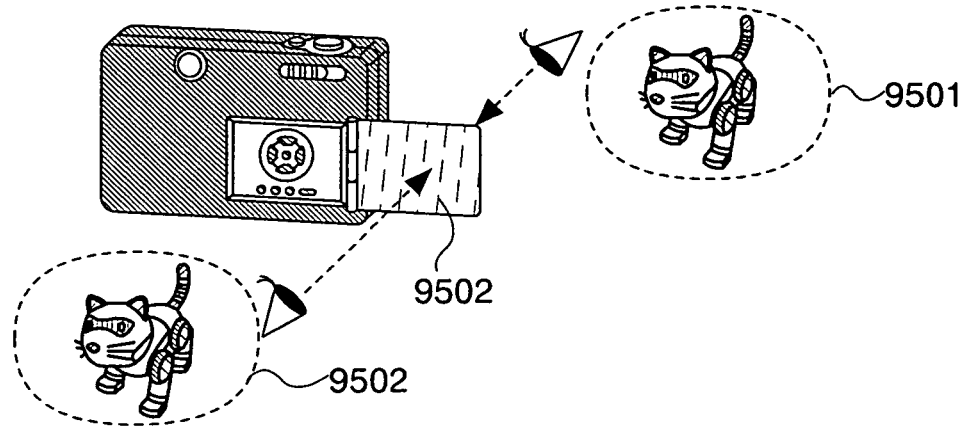
Figure 19D:
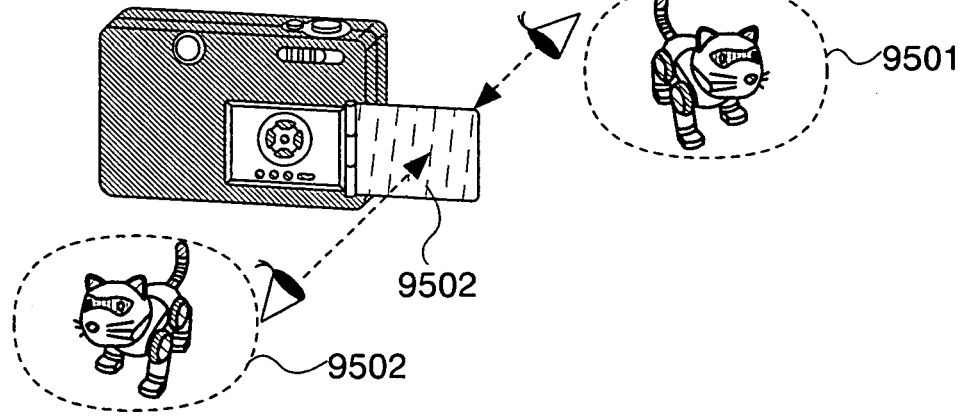

A camera such as a digital video camera includes a display 9301, a display 9302, a display 9303 and the like (see FIGS. 18F and 18G). The invention can be applied to a display device including the display 9301 and the display 9303.

A camera such as a digital camera includes a display 9501, a display 9502, a lens 9503 and the like (see FIGS. 19A to 19D). The invention can be applied to a display device including the display 9501 and the display 9502. In the camera such as the digital camera, the display 9501 is used when the digital camera is closed (see FIG. 19B) and one or both of the displays 9501 and 9502 is used when the digital camera is open (see FIG. 19C). By displaying the same image on the displays 9501 and 9502 when the digital camera is open, a photographer and a person as a subject can both check the photographed image at the same time (see FIG. 19C). Further, the display 9501 may perform a horizontal inverted display while the display 9502 may perform a normal display (see FIG. 19D). In this manner, when the display 9501 performs a horizontal inverted display, a person as a subject sees a mirror image. That is, a person as a subject can see a mirror image of himself which he normally sees by using a mirror, thus he can be relaxed. Further, a mirror image can also be used for setting one's appearance.

An electronic device to which a display device in accordance with the invention is applied is not limited to the aforementioned. Examples are a television device (also referred to as a TV device, a television receiving device, a television receiver, and a television), a camera such as a digital camera and a digital video camera, a portable phone device (also referred to as a portable phone and a cell phone), a portable information terminal (PDA (Personal Digital Assistant) and the like), a portable game machine, a monitor, a notebook personal computer, a tablet PC, an audio reproducing device such as a car audio set, an image reproducing device provided with a recording medium such as a home game machine, and the like. Among the electronic devices, a portable electronic device such as a portable phone device, a portable information terminal, a camera such as a digital video camera and a digital camera has a compact housing to be easily carried, thus the housing has limited volume inside. Therefore, the invention which is compact and thin can be effectively applied. This embodiment mode can be freely implemented in combination with the aforementioned embodiment modes.

Figure 31A:
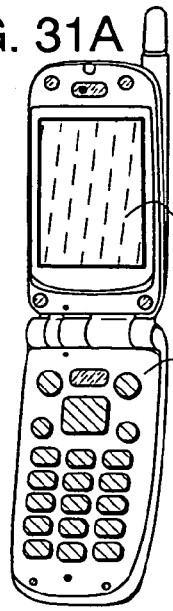
FIGS. 31A to 31G are views, each of which shows an electronic device using a display device of the invention.
Figure 31B:
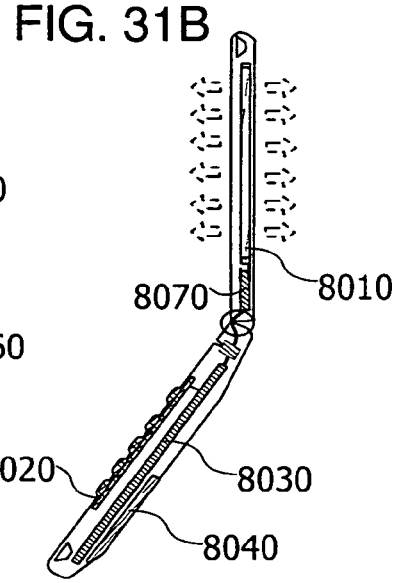
Figure 31C:
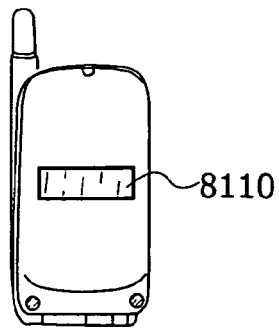

A portable phone device which is different from the aforementioned one includes a panel 8010, an operating button 8020, printed substrates 8030 and 8070, a battery 8040, a housing 8060, a display 8100, a display 8110 and the like (see FIGS. 31A to 31C). The areas of the displays 8100 and 8110 are different from each other. The invention can be applied to a display device having the displays 8100 and 8110.

Figure 31D:
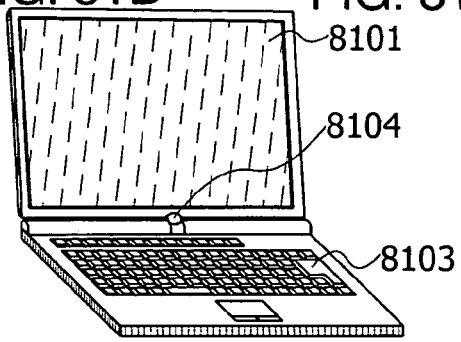
Figure 31E:
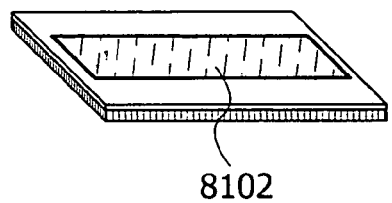

Further, a portable information terminal which is different from the aforementioned one includes a display 8101, a display 8102, a button 8103, a rotation axis 8104 and the like (see FIGS. 31D and 31E). The areas of the displays 8101 and 8102 are different from each other. The invention can be applied to a display device having the displays 8101 and 8102.

Figure 31F:
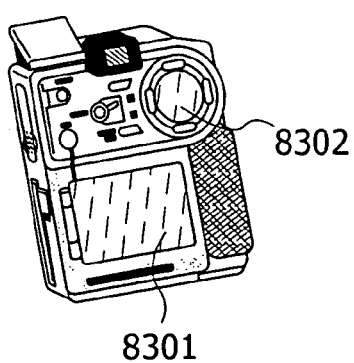
Figure 31G:
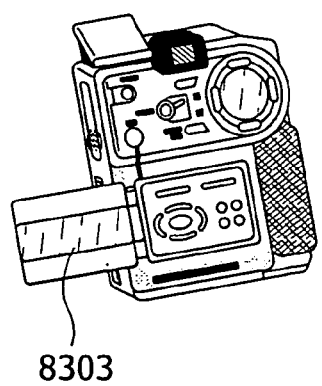

Further, a camera such as a digital camera which is different from the aforementioned one includes a display 8301, a display 8302, a display 8303 and the like (see FIGS. 31F and 31G). The areas of the displays 8301 and 8303 are different from each other. The invention can be applied to a display device having the displays 8301 and 8303.

This application is based on Japanese Patent Applications serial no. 2004-336604 filed in Japan Patent Office on 19, Nov., 2004, and serial no. 2004-339652 filed in Japan Patent Office on 24, Nov., 2004, and the entire contents of which are hereby incorporated by reference.

What is claimed is:
1. A display device comprising:
   a first substrate provided with a first light emitting element adjacent to a first surface of the first substrate;

a second substrate provided with a second light emitting element adjacent to a first surface of the second substrate; and a third substrate, wherein the first surface of the first substrate and a second surface of the second substrate face each other;

wherein the first surface of the second substrate and first surface of the third substrate face each other;

wherein the first light emitting element emits light through a second surface of the first substrate;

wherein the second light emitting element emits light through a second surface of the third substrate;

wherein a first display is adjacent to the second surface of the first substrate; and wherein a second display is adjacent to the second surface of the third substrate.

2. The display device according to claim 1, wherein a first film electrically connected to the first light emitting element is adjacent to the first surface of the first substrate; and wherein a second film electrically connected to the second light emitting element is adjacent to the first surface of the second substrate.

3. The display device according to claim 1, wherein a first flexible printed wiring board electrically connected to the first light emitting element is adjacent to the first surface of the first substrate; and wherein a second flexible printed wiring board electrically connected to the second light emitting element is adjacent to the first surface of the second substrate.

4. The display device according to claim 1, wherein a transistor for controlling light emission of the first light emitting element is adjacent to the first substrate.

5. The display device according to claim 1, wherein a transistor for controlling light emission of the second light emitting element is adjacent to the second substrate.

6. The display device according to claim 1, wherein a first driver circuit for driving the first light emitting element is adjacent to the first surface of the first substrate.

7. The display device according to claim 1, wherein a second driver circuit for driving the second light emitting element is adjacent to the first surface of the second substrate.

8. The display device according to claim 1, wherein a controller circuit for controlling the first light emitting element and the second light emitting element is adjacent to the first substrate or the second substrate.

9. The display device according to claim 1, wherein a power source circuit for supplying a power source potential to the first light emitting element and the second light emitting element is adjacent to the first substrate or the second substrate.

10. The display device according to claim 1, wherein a controller circuit for controlling the first light emitting element and the second light emitting element is adjacent to the first surface of the first substrate or the first surface of the second substrate.

11. The display device according to claim 1, wherein a power source circuit for supplying a power source potential to the first light emitting element and the second light emitting element is adjacent to the first surface of the first substrate or the first surface of the second substrate.

12. The display device according to claim 1, wherein a switching circuit and a controller circuit for controlling the first light emitting element or the second light emitting element based on a signal outputted from the switching circuit are adjacent to the first surface of the first substrate or the first surface of the second substrate.

13. The display device according to claim 1, wherein a switching circuit and a power source circuit for supplying a power source potential to the first light emitting element or the second light emitting element based on a signal outputted from the switching circuit are adjacent to the first surface of the first substrate or the first surface of the second substrate.

14. The display device according to claim 1, wherein a switching circuit and a controller circuit for controlling the first light emitting element or the second light emitting element based on a signal outputted from the switching circuit are adjacent to the first surface of the first substrate or the first surface of the second substrate.

15. The display device according to claim 1, wherein a switching circuit and a power source circuit for supplying a power source potential to the first light emitting element or the second light emitting element based on a signal outputted from the switching circuit are adjacent to the first surface of the first substrate or the first surface of the second substrate.

16. An electronic device using the display device according to claim 1.

* * * * *